US012191418B2

United States Patent
He et al.

(10) Patent No.: US 12,191,418 B2
(45) Date of Patent: Jan. 7, 2025

(54) MONOLITHIC INTEGRATION OF DIFFERENT LIGHT EMITTING STRUCTURES ON A SAME SUBSTRATE

(71) Applicant: GOOGLE LLC, Mountain View, CA (US)

(72) Inventors: Gang He, Cupertino, CA (US); Sheila K. Hurtt, Palo Alto, CA (US)

(73) Assignee: GOOGLE LLC, Mountain View, CA (US)

( * ) Notice: Subject to any disclaimer, the term of this patent is extended or adjusted under 35 U.S.C. 154(b) by 0 days.

(21) Appl. No.: 18/305,778

(22) Filed: Apr. 24, 2023

(65) Prior Publication Data

US 2023/0387348 A1 Nov. 30, 2023

Related U.S. Application Data

(63) Continuation of application No. 16/841,119, filed on Apr. 6, 2020, now Pat. No. 11,637,219.

(Continued)

(51) Int. Cl.
*H01L 33/24* (2010.01)
*H01L 27/15* (2006.01)
(Continued)

(52) U.S. Cl.
CPC ............ *H01L 33/24* (2013.01); *H01L 27/156* (2013.01); *H01L 33/06* (2013.01); *H01L 33/325* (2013.01)

(58) Field of Classification Search
CPC ... H01L 27/30; H01L 27/3239; H01L 31/143; H01L 31/162; H01L 33/08; H01L 33/18;
(Continued)

(56) References Cited

U.S. PATENT DOCUMENTS 2,403,731 A 7/1946 MacNeille
3,936,817 A 2/1976 Levy et al.
(Continued)

FOREIGN PATENT DOCUMENTS

EP 0658870 A2 6/1995
EP 1187087 A1 3/2002
(Continued)

OTHER PUBLICATIONS

International Search Report and Written Opinion from PCT Application No. PCT/US2020/027574, Jun. 15, 2020.
(Continued)

*Primary Examiner* — Moin M Rahman
(74) *Attorney, Agent, or Firm* — Brake Hughes Bellermann LLP

(57) ABSTRACT

The disclosure describes various aspects of monolithic integration of different light emitting structures on a same substrate. In an aspect, a device for light generation is described having a substrate with one or more buffer layers made a material that includes GaN. The device also includes light emitting structures, which are epitaxially grown on a same surface of a top buffer layer of the substrate, where each light emitting structure has an active area parallel to the surface and laterally terminated, and where the active area of different light emitting structures is configured to directly generate a different color of light. The device also includes a p-doped layer disposed over the active area of each light emitting structure and made of a p-doped material that includes GaN. The device may be part of a light field display and may be connected to a backplane of the light field display.

20 Claims, 22 Drawing Sheets

Related U.S. Application Data

(60) Provisional application No. 62/833,072, filed on Apr. 12, 2019.

(51) Int. Cl.
*H01L 33/06* (2010.01)
*H01L 33/32* (2010.01)

(58) Field of Classification Search
CPC ... H01L 33/24; H01L 51/5032; H01L 25/048;
H01L 27/288; H01L 27/32; H01L 33/06;
H01L 33/26; H01L 51/0032; H01L 51/50;
H01L 2251/50; H01L 51/5068; H01L
51/5084; H01L 51/5296; H01L
2051/0032; H01L 2227/32; H01L 25/167;
H01L 27/153; H01L 27/3202; H01L
27/3204; H01L 27/3209; H01L 27/3225;
H01L 27/3251; H01L 51/525; H01L
51/5287; H01L 2227/326; H01L
2251/5323; H01L 2251/5338; H01L
2251/5353; H01L 2251/56; H01L
2251/566; H01L 29/12041; H01L
29/12044; H01L 51/5209; H01L 27/3262;
H01L 27/3258; H01L 27/3248; H01L
27/322; H01L 51/5225; H01L 51/5268;
H01L 2251/558; H01L 2251/303; H01L
2251/306; H01L 2251/308; H01L
51/5218; H01L 51/5271; H01L 51/5275;
H01L 51/0005; H01L 51/5012; H01L
51/5206; H01L 51/5221; H01L 51/56;
H01L 27/3244; H01L 2227/323; H01L
33/382; H01L 33/387; H01L 33/504;
H01L 33/507; H01L 25/0753; H01L
27/156; H01L 33/56; H01L 33/62; H01L
2224/48091; H01L 2224/48137; H01L
33/647; H01L 33/486; H01L 2224/45144;
H01L 33/54; H01L 33/641; H01L 33/60
See application file for complete search history.

(56) References Cited

U.S. PATENT DOCUMENTS

| | | | |
|---|---|---|---|
| 4,432,610 A | 2/1984 | Kobayashi et al. |
| 1,825,201 A | 4/1989 | Watanabe et al. |
| 4,923,285 A | 5/1990 | Ogino et al. |
| 4,996,523 A | 2/1991 | Bell et al. |
| 5,018,838 A | 5/1991 | Barnes et al. |
| 5,144,418 A | 9/1992 | Brown et al. |
| 5,157,387 A | 10/1992 | Momose et al. |
| 5,189,406 A | 2/1993 | Humphries et al. |
| 5,300,788 A | 4/1994 | Fan et al. |
| 5,317,334 A | 5/1994 | Sano |
| 5,359,342 A | 10/1994 | Nakai et al. |
| 5,376,580 A | 12/1994 | Kish et al. |
| 5,471,225 A | 11/1995 | Parks |
| 5,473,338 A | 12/1995 | Prince et al. |
| 5,497,172 A | 3/1996 | Doherty et al. |
| 5,537,128 A | 7/1996 | Keene et al. |
| 5,548,347 A | 8/1996 | Melnik et al. |
| 5,566,010 A | 10/1996 | Ishii et al. |
| 5,602,559 A | 2/1997 | Kimura |
| 5,619,228 A | 4/1997 | Doherty |
| 5,623,181 A | 4/1997 | Suehiro et al. |
| 5,731,802 A | 3/1998 | Aras et al. |
| 5,739,552 A | 4/1998 | Kimura et al. |
| 5,751,264 A | 5/1998 | Cavallerano et al. |
| 5,767,832 A | 6/1998 | Koyama et al. |
| 5,818,413 A | 10/1998 | Hayashi et al. |
| 5,905,482 A | 5/1999 | Hughes et al. |
| 5,926,158 A | 7/1999 | Yoneda et al. |
| 5,926,162 A | 7/1999 | Wood et al. |
| 5,936,603 A | 8/1999 | Lippmann et al. |
| 5,936,604 A | 8/1999 | Endou |
| 5,945,972 A | 8/1999 | Okumura et al. |
| 5,959,598 A | 9/1999 | McKnight |
| 5,966,396 A | 10/1999 | Okazaki et al. |
| 5,969,512 A | 10/1999 | Matsuyama |
| 5,969,701 A | 10/1999 | Numao et al. |
| 5,986,640 A | 11/1999 | Baldwin et al. |
| 6,005,558 A | 12/1999 | Hudson et al. |
| 6,034,659 A | 3/2000 | Wald et al. |
| 6,046,716 A | 4/2000 | McKnight |
| 6,067,065 A | 5/2000 | Worley et al. |
| 6,100,103 A | 8/2000 | Shim et al. |
| 6,121,948 A | 9/2000 | Worley et al. |
| 6,127,991 A | 10/2000 | Uehara et al. |
| 6,144,356 A | 11/2000 | Weatherford et al. |
| 6,151,011 A | 11/2000 | Worley et al. |
| RE37,056 E | 2/2001 | Wortel et al. |
| 6,201,521 B1 | 3/2001 | Doherty |
| 6,262,703 B1 | 7/2001 | Perner |
| 6,285,360 B1 | 9/2001 | Li |
| 6,297,788 B1 | 10/2001 | Shigeta et al. |
| 6,317,112 B1 | 11/2001 | Handschy et al. |
| 6,369,782 B2 | 4/2002 | Shigeta |
| 6,424,330 B1 | 7/2002 | Johnson |
| 6,456,267 B1 | 9/2002 | Sato et al. |
| 6,476,792 B2 | 11/2002 | Hattori et al. |
| 6,518,945 B1 | 2/2003 | Pinkham |
| 6,525,464 B1 | 2/2003 | Chin |
| 6,563,139 B2 | 5/2003 | Hen |
| 6,567,138 B1 | 5/2003 | Krusius et al. |
| 6,576,933 B2 | 6/2003 | Sugawara et al. |
| 6,586,874 B1 | 7/2003 | Komoto et al. |
| 6,587,084 B1 | 7/2003 | Alymov et al. |
| 6,603,452 B1 | 8/2003 | Serita |
| 6,621,488 B1 | 9/2003 | Takeuchi et al. |
| 6,642,545 B2 | 11/2003 | Okazaki |
| 6,677,617 B2 | 1/2004 | Tominaga |
| 6,690,432 B2 | 2/2004 | Janssen et al. |
| 6,717,561 B1 | 4/2004 | Pfeiffer et al. |
| 6,731,306 B2 | 5/2004 | Booth et al. |
| 6,744,415 B2 | 6/2004 | Waterman et al. |
| 6,762,739 B2 | 7/2004 | Bone |
| 6,777,253 B2 | 8/2004 | Ishibashi et al. |
| 6,784,898 B2 | 8/2004 | Lee et al. |
| 6,788,231 B1 | 9/2004 | Hsueh |
| 6,806,871 B1 | 10/2004 | Yasue |
| 6,817,735 B2 | 11/2004 | Shimizu et al. |
| 6,831,626 B2 | 12/2004 | Nakamura et al. |
| 6,850,216 B2 | 2/2005 | Akimoto et al. |
| 6,862,012 B1 | 3/2005 | Funakoshi et al. |
| 6,924,824 B2 | 8/2005 | Adachi et al. |
| 6,930,667 B1 | 8/2005 | Iijima et al. |
| 6,930,692 B1 | 8/2005 | Coker et al. |
| 6,989,555 B2 | 1/2006 | Goetz et al. |
| 7,064,354 B2 | 6/2006 | Chen |
| 7,066,605 B2 | 6/2006 | Dewald et al. |
| 7,067,853 B1 | 6/2006 | Yao |
| 7,088,325 B2 | 8/2006 | Ishii |
| 7,088,329 B2 | 8/2006 | Hudson |
| 7,129,920 B2 | 10/2006 | Chow |
| 7,132,677 B2 | 11/2006 | Kim et al. |
| 7,187,355 B2 | 3/2007 | Tam et al. |
| 7,279,718 B2 | 10/2007 | Krames et al. |
| 7,289,089 B2 | 10/2007 | Wafuchi |
| 7,301,172 B2 | 11/2007 | Atwater et al. |
| 7,309,144 B2 | 12/2007 | Foong et al. |
| 7,319,241 B2 | 1/2008 | Park |
| 7,358,524 B2 | 4/2008 | Lee et al. |
| 7,379,043 B2 | 5/2008 | Worley et al. |
| 7,393,710 B2 | 7/2008 | Kim et al. |
| 7,397,068 B2 | 7/2008 | Park et al. |
| 7,397,980 B2 | 7/2008 | Frisken |
| 7,435,996 B2 | 10/2008 | Jin et al. |
| 7,443,374 B2 | 10/2008 | Hudson |
| 7,453,097 B2 | 11/2008 | Jin et al. |
| 7,468,717 B2 | 12/2008 | Hudson |
| 7,501,663 B2 | 3/2009 | Okuyama et al. |

(56) References Cited

U.S. PATENT DOCUMENTS

| | | |
|---|---|---|
| 7,514,720 B2 | 4/2009 | Kim et al. |
| 7,554,109 B2 | 6/2009 | Stokes et al. |
| 7,554,752 B2 | 6/2009 | Tamaoki et al. |
| 7,623,560 B2 | 11/2009 | El-Ghoroury et al. |
| 7,635,876 B2 | 12/2009 | Shen |
| 7,642,560 B2 | 1/2010 | Ogihara |
| 7,663,148 B2 | 2/2010 | Yi et al. |
| 7,670,581 B2 | 3/2010 | Korgel et al. |
| 7,687,820 B2 | 3/2010 | Song |
| 7,692,671 B2 | 4/2010 | Ng |
| 7,741,647 B2 | 6/2010 | Wang et al. |
| 7,777,233 B2 | 8/2010 | Kahen et al. |
| 7,839,467 B2 | 11/2010 | Miner et al. |
| 7,847,304 B2 | 12/2010 | Taninaka et al. |
| 7,850,347 B2 | 12/2010 | Speier et al. |
| 7,852,307 B2 | 12/2010 | Hudson |
| 7,880,180 B2 | 2/2011 | Tada et al. |
| 7,922,352 B2 | 4/2011 | Chua et al. |
| 7,935,972 B2 | 5/2011 | Plank |
| 7,947,548 B2 | 5/2011 | Altebaeumer et al. |
| 7,977,694 B2 | 7/2011 | David et al. |
| 7,982,228 B2 | 7/2011 | Choi et al. |
| 7,990,353 B2 | 8/2011 | Chow |
| 7,994,524 B1 | 8/2011 | Chung et al. |
| 8,003,974 B2 | 8/2011 | Heidborn et al. |
| 8,003,992 B2 | 8/2011 | Kim et al. |
| 8,008,672 B2 | 8/2011 | Moon et al. |
| 8,017,955 B2 | 9/2011 | Wang et al. |
| 8,035,115 B2 | 10/2011 | Ogihara et al. |
| 8,040,311 B2 | 10/2011 | Hudson et al. |
| 8,111,271 B2 | 2/2012 | Hudson et al. |
| 8,120,011 B2 | 2/2012 | Hsu |
| 8,148,178 B2 | 4/2012 | Paek et al. |
| 8,163,575 B2 | 4/2012 | Wierer et al. |
| 8,174,032 B2 | 5/2012 | Aliyev et al. |
| 8,212,266 B2 | 7/2012 | Lee et al. |
| 8,212,275 B2 | 7/2012 | Yamada |
| 8,227,818 B2 | 7/2012 | Weisbuch et al. |
| 8,247,790 B2 | 8/2012 | Kim |
| 8,264,507 B2 | 9/2012 | Hudson et al. |
| 8,269,229 B2 | 9/2012 | Suzuki et al. |
| 8,283,215 B2 | 10/2012 | Or-Bach et al. |
| 8,330,173 B2 | 12/2012 | Kim |
| 8,338,839 B2 | 12/2012 | Lerman et al. |
| 8,342,708 B2 | 1/2013 | Kim |
| 8,362,500 B2 | 1/2013 | Park |
| 8,378,363 B2 | 2/2013 | Hsu |
| 8,384,096 B2 | 2/2013 | Herrmann |
| 8,399,895 B2 | 3/2013 | Shakuda |
| 8,421,058 B2 | 4/2013 | Liu et al. |
| 8,421,828 B2 | 4/2013 | Hudson et al. |
| 8,431,817 B2 | 4/2013 | Kim et al. |
| 8,436,334 B2 | 5/2013 | Soh et al. |
| 8,441,018 B2 | 5/2013 | Lee et al. |
| 8,461,601 B2 | 6/2013 | Herrmann |
| 8,476,637 B2 | 7/2013 | Kim et al. |
| 8,513,690 B2 | 8/2013 | Lai |
| 8,541,803 B2 | 9/2013 | Smith et al. |
| 8,556,438 B2 | 10/2013 | Lee et al. |
| 8,558,264 B2 | 10/2013 | Mochizuki |
| 8,563,395 B2 | 10/2013 | Mi |
| 8,563,985 B2 | 10/2013 | Mochizuki |
| 8,573,784 B2 | 11/2013 | Yeh et al. |
| 8,581,093 B2 | 11/2013 | Hsieh et al. |
| 8,624,270 B2 | 1/2014 | Park |
| 8,629,425 B2 | 1/2014 | Soh et al. |
| 8,643,029 B2 | 2/2014 | Lee et al. |
| 8,643,681 B2 | 2/2014 | Endo et al. |
| 8,648,328 B2 | 2/2014 | Crowder et al. |
| 8,648,329 B2 | 2/2014 | Mochizuki |
| 8,648,357 B2 | 2/2014 | Herrmann |
| 8,659,037 B2 | 2/2014 | Kim et al. |
| 8,669,128 B2 | 3/2014 | Gwo et al. |
| 8,669,574 B2 | 3/2014 | Konsek et al. |
| 8,674,339 B2 | 3/2014 | Kim |
| 8,686,451 B2 | 4/2014 | Gmeinwieser et al. |
| 8,710,533 B2 | 4/2014 | Haase et al. |
| 8,735,913 B2 | 5/2014 | Kuo |
| 8,745,556 B2 | 6/2014 | Chen et al. |
| 8,779,445 B2 | 7/2014 | Yu et al. |
| 8,796,720 B2 | 8/2014 | Jin et al. |
| 8,823,034 B2 | 9/2014 | Bergbauer et al. |
| 8,823,157 B2 | 9/2014 | Chang et al. |
| 8,835,948 B2 | 9/2014 | Chang et al. |
| 8,847,249 B2 | 9/2014 | Raring et al. |
| 8,865,493 B2 | 10/2014 | Kelley et al. |
| 8,872,420 B2 | 10/2014 | Brindisi |
| 8,921,141 B2 | 12/2014 | Kryliouk et al. |
| 8,969,900 B2 | 3/2015 | Sabathil et al. |
| 8,981,403 B2 | 3/2015 | Shatalov et al. |
| 8,999,737 B2 | 4/2015 | Harvey et al. |
| 9,000,464 B2 | 4/2015 | Chang et al. |
| 9,024,292 B2 | 5/2015 | Li |
| 9,035,324 B2 | 5/2015 | Kim |
| 9,047,818 B1 | 6/2015 | Day et al. |
| 9,054,233 B2 | 6/2015 | Ohlsson et al. |
| 9,070,613 B2 | 6/2015 | Hwang |
| 9,076,667 B2 | 7/2015 | Wu et al. |
| 9,082,926 B2 | 7/2015 | Freund et al. |
| 9,093,607 B2 | 7/2015 | Gilet et al. |
| 9,117,746 B1 | 8/2015 | Clark et al. |
| 9,136,253 B2 | 9/2015 | Katsuno et al. |
| 9,142,535 B2 | 9/2015 | Oraw |
| 9,142,745 B2 | 9/2015 | Harvey et al. |
| 9,202,994 B2 | 12/2015 | Hashimoto et al. |
| 9,257,596 B2 | 2/2016 | Strabburg et al. |
| 9,257,611 B2 | 2/2016 | Mandl et al. |
| 9,257,616 B2 | 2/2016 | Harvey et al. |
| 9,281,442 B2 | 3/2016 | Romano et al. |
| 9,287,445 B2 | 3/2016 | Yoo et al. |
| 9,287,468 B2 | 3/2016 | Herner et al. |
| 9,299,725 B2 | 3/2016 | Voutsas |
| 9,356,204 B2 | 5/2016 | Mcrae |
| 9,362,448 B2 | 6/2016 | Choi et al. |
| 9,379,281 B2 | 6/2016 | Sarkissian |
| 9,401,453 B2 | 7/2016 | Choi |
| 9,406,269 B2 | 8/2016 | Lo et al. |
| 9,406,839 B2 | 8/2016 | Kim et al. |
| 9,412,899 B2 | 8/2016 | Herner et al. |
| 9,455,421 B2 | 9/2016 | Li |
| 9,461,199 B2 | 10/2016 | Heo et al. |
| 9,472,734 B1 | 10/2016 | Chen et al. |
| 9,484,332 B2 | 11/2016 | Natarajan et al. |
| 9,507,143 B2 | 11/2016 | Abele et al. |
| 9,508,898 B2 | 11/2016 | Chung et al. |
| 9,520,537 B2 | 12/2016 | Bower et al. |
| 9,557,954 B2 | 1/2017 | Jepsen et al. |
| 9,583,031 B2 | 2/2017 | Hudson et al. |
| 9,591,729 B2 | 3/2017 | Patton |
| 9,620,559 B2 | 4/2017 | Schubert et al. |
| 9,627,650 B2 | 4/2017 | Seo et al. |
| 9,640,108 B2 | 5/2017 | Cok et al. |
| 9,647,029 B2 | 5/2017 | Lo et al. |
| 9,660,135 B2 | 5/2017 | El-Ghoroury et al. |
| 9,698,134 B2 | 7/2017 | Li et al. |
| 9,698,308 B2 | 7/2017 | Bower et al. |
| 9,716,082 B2 | 7/2017 | Bower et al. |
| 9,720,163 B2 | 8/2017 | Wang et al. |
| 9,721,931 B2 | 8/2017 | Huang et al. |
| 9,726,802 B2 | 8/2017 | Wang et al. |
| 9,793,252 B2 | 10/2017 | Ghosh |
| 9,793,439 B2 | 10/2017 | Lunev et al. |
| 9,799,719 B2 | 10/2017 | Cok |
| 9,818,725 B2 | 11/2017 | Bower et al. |
| 9,824,619 B2 | 11/2017 | Hudson et al. |
| 9,847,446 B2 | 12/2017 | Cagli et al. |
| 9,893,041 B2 | 2/2018 | Pokhriyal et al. |
| 9,893,233 B2 | 2/2018 | Kong et al. |
| 9,903,994 B2 | 2/2018 | Park et al. |
| 9,918,053 B2 | 3/2018 | Lo et al. |
| 9,922,593 B2 | 3/2018 | Tripathi |
| 9,928,771 B2 | 3/2018 | Cok |
| 9,941,262 B2 | 4/2018 | Thompson |
| 9,947,829 B2 | 4/2018 | Ohlsson |

(56) References Cited

U.S. PATENT DOCUMENTS

| | | |
|---|---|---|
| 9,960,205 B2 | 5/2018 | Bouvier et al. |
| 10,193,038 B2 | 1/2019 | Farrens et al. |
| 10,229,630 B2 | 3/2019 | Lau et al. |
| 10,431,717 B1 | 10/2019 | Dasgupta et al. |
| 10,437,402 B1 | 10/2019 | Pan |
| 10,546,796 B2 | 1/2020 | Hu et al. |
| 10,784,241 B2 | 9/2020 | Chang et al. |
| 10,957,272 B2 | 3/2021 | Li et al. |
| 10,957,818 B2 | 3/2021 | Ahmed |
| 2001/0013844 A1 | 8/2001 | Shigeta |
| 2002/0024481 A1 | 2/2002 | Kawabe et al. |
| 2002/0041266 A1 | 4/2002 | Koyama et al. |
| 2002/0043610 A1 | 4/2002 | Lee et al. |
| 2002/0135309 A1 | 9/2002 | Okuda |
| 2002/0140662 A1 | 10/2002 | Igarashi |
| 2002/0158825 A1 | 10/2002 | Endo et al. |
| 2003/0058195 A1 | 3/2003 | Adachi et al. |
| 2003/0156102 A1 | 8/2003 | Kimura |
| 2003/0174117 A1 | 9/2003 | Crossland et al. |
| 2003/0189215 A1 | 10/2003 | Lee et al. |
| 2003/0210257 A1 | 11/2003 | Hudson et al. |
| 2004/0032636 A1 | 2/2004 | Willis |
| 2004/0080482 A1 | 4/2004 | Magendanz et al. |
| 2004/0125090 A1 | 7/2004 | Hudson |
| 2004/0174328 A1 | 9/2004 | Hudson |
| 2005/0001794 A1 | 1/2005 | Nakanishi et al. |
| 2005/0001806 A1 | 1/2005 | Ohmura |
| 2005/0052437 A1 | 3/2005 | Hudson |
| 2005/0057466 A1 | 3/2005 | Sala et al. |
| 2005/0062765 A1 | 3/2005 | Hudson |
| 2005/0088462 A1 | 4/2005 | Borel |
| 2005/0146270 A1 | 7/2005 | Ho |
| 2005/0195894 A1 | 9/2005 | Kim et al. |
| 2005/0199892 A1 | 9/2005 | Cho et al. |
| 2005/0200300 A1 | 9/2005 | Yumoto |
| 2005/0264586 A1 | 12/2005 | Kim |
| 2006/0012589 A1 | 1/2006 | Hsieh et al. |
| 2006/0012594 A1 | 1/2006 | Worley et al. |
| 2006/0066645 A1 | 3/2006 | Ng |
| 2006/0147146 A1 | 7/2006 | Voigt et al. |
| 2006/0208961 A1 | 9/2006 | Nathan et al. |
| 2006/0223211 A1 | 10/2006 | Mishra et al. |
| 2006/0284903 A1 | 12/2006 | Ng |
| 2006/0284904 A1 | 12/2006 | Ng |
| 2007/0018189 A1 | 1/2007 | Chin et al. |
| 2007/0137698 A1 | 6/2007 | Wanlass et al. |
| 2007/0252855 A1 | 11/2007 | Hudson |
| 2007/0252856 A1 | 11/2007 | Hudson et al. |
| 2007/0262323 A1 | 11/2007 | Sonobe et al. |
| 2008/0007576 A1 | 1/2008 | Ishii et al. |
| 2008/0088613 A1 | 4/2008 | Hudson et al. |
| 2008/0121902 A1 | 5/2008 | Sackrison et al. |
| 2008/0158437 A1 | 7/2008 | Arai et al. |
| 2008/0191191 A1 | 8/2008 | Kim |
| 2008/0251799 A1 | 10/2008 | Ikezawa |
| 2008/0259019 A1 | 10/2008 | Ng |
| 2009/0027360 A1 | 1/2009 | Kwan et al. |
| 2009/0027364 A1 | 1/2009 | Kwan et al. |
| 2009/0115703 A1 | 5/2009 | Cok |
| 2009/0284671 A1 | 11/2009 | Leister |
| 2009/0303248 A1 | 12/2009 | Ng |
| 2009/0309127 A1 | 12/2009 | Raring et al. |
| 2009/0315045 A1* | 12/2009 | Horie .................. H01L 27/153 438/34 |
| 2010/0073270 A1 | 3/2010 | Ishii et al. |
| 2010/0148147 A1 | 6/2010 | Bour et al. |
| 2010/0214646 A1 | 8/2010 | Sugimoto et al. |
| 2010/0253995 A1 | 10/2010 | Reichelt |
| 2010/0283064 A1 | 11/2010 | Samuelson et al. |
| 2010/0283074 A1 | 11/2010 | Kelley et al. |
| 2010/0295836 A1 | 11/2010 | Matsumoto et al. |
| 2010/0309100 A1 | 12/2010 | Cok et al. |
| 2010/0321640 A1 | 12/2010 | Yeh et al. |
| 2011/0109299 A1 | 5/2011 | Chaji et al. |
| 2011/0109670 A1 | 5/2011 | Sempel et al. |
| 2011/0199405 A1 | 8/2011 | Dallas et al. |
| 2011/0204376 A1 | 8/2011 | Su et al. |
| 2011/0205100 A1 | 8/2011 | Bogaerts |
| 2011/0227887 A1 | 9/2011 | Dallas et al. |
| 2011/0254019 A1 | 10/2011 | Hsu |
| 2011/0316033 A1 | 12/2011 | Sugimori et al. |
| 2012/0086733 A1 | 4/2012 | Hudson et al. |
| 2012/0113167 A1 | 5/2012 | Margerm et al. |
| 2012/0161173 A1 | 6/2012 | Shen |
| 2012/0205620 A1 | 8/2012 | Sato et al. |
| 2012/0305959 A1 | 12/2012 | Yu et al. |
| 2013/0016494 A1 | 1/2013 | Speier et al. |
| 2013/0020582 A1 | 1/2013 | Zimmerman et al. |
| 2013/0038585 A1 | 2/2013 | Kasai |
| 2013/0207072 A1 | 8/2013 | Chang et al. |
| 2013/0248817 A1 | 9/2013 | Kim |
| 2013/0259079 A1 | 10/2013 | Bhattacharya et al. |
| 2013/0264587 A1 | 10/2013 | Chang |
| 2013/0270514 A1 | 10/2013 | Saxler |
| 2013/0285010 A1 | 10/2013 | Lu |
| 2013/0285885 A1 | 10/2013 | Nowatzyk et al. |
| 2013/0308057 A1 | 11/2013 | Lu et al. |
| 2013/0313516 A1 | 11/2013 | David et al. |
| 2014/0085426 A1 | 3/2014 | Leone et al. |
| 2014/0092105 A1 | 4/2014 | Guttag et al. |
| 2014/0218909 A1 | 8/2014 | Tetsuo et al. |
| 2015/0137150 A1 | 5/2015 | Li et al. |
| 2015/0179894 A1 | 6/2015 | Herner et al. |
| 2015/0245038 A1 | 8/2015 | Clatanoff et al. |
| 2015/0249820 A1 | 9/2015 | Saigo et al. |
| 2015/0349214 A1 | 12/2015 | Meyer et al. |
| 2015/0372393 A1 | 12/2015 | Bower et al. |
| 2016/0035259 A1 | 2/2016 | Brindisi |
| 2016/0149075 A1 | 5/2016 | Atanackovic |
| 2016/0163940 A1 | 6/2016 | Huang et al. |
| 2016/0203801 A1 | 7/2016 | De Groot et al. |
| 2016/0218143 A1 | 7/2016 | Chaji et al. |
| 2016/0284673 A1* | 9/2016 | Kong .................... H01L 27/156 |
| 2016/0336482 A1 | 11/2016 | Lu et al. |
| 2016/0336487 A1 | 11/2016 | Wang |
| 2016/0343771 A1 | 11/2016 | Bower et al. |
| 2016/0359084 A1 | 12/2016 | El-Ghoroury et al. |
| 2016/0365055 A9 | 12/2016 | Hudson et al. |
| 2016/0380153 A1 | 12/2016 | Lee et al. |
| 2017/0025075 A1 | 1/2017 | Cok et al. |
| 2017/0040240 A1 | 2/2017 | Heidelberger et al. |
| 2017/0054055 A1 | 2/2017 | Kim et al. |
| 2017/0062674 A1 | 3/2017 | Kwon et al. |
| 2017/0068362 A1 | 3/2017 | Den Boer et al. |
| 2017/0076123 A1 | 3/2017 | Guagliumi et al. |
| 2017/0102797 A1 | 4/2017 | Cok |
| 2017/0117438 A1 | 4/2017 | Shur et al. |
| 2017/0133818 A1 | 5/2017 | Cok |
| 2017/0162552 A1* | 6/2017 | Thompson .......... H01L 33/0093 |
| 2017/0170363 A1 | 6/2017 | Volkova et al. |
| 2017/0213934 A1 | 7/2017 | Grundmann et al. |
| 2017/0236807 A1 | 8/2017 | Hwang et al. |
| 2017/0242549 A1 | 8/2017 | Lim et al. |
| 2017/0256522 A1 | 9/2017 | Cok et al. |
| 2017/0263178 A1 | 9/2017 | Bae et al. |
| 2017/0269749 A1 | 9/2017 | Bok et al. |
| 2017/0271312 A1 | 9/2017 | Kwon |
| 2017/0287882 A1 | 10/2017 | Cok et al. |
| 2017/0288093 A1 | 10/2017 | Cha et al. |
| 2017/0309798 A1 | 10/2017 | Bonar et al. |
| 2017/0323925 A1 | 11/2017 | Schneider et al. |
| 2017/0330509 A1 | 11/2017 | Cok et al. |
| 2017/0358717 A1 | 12/2017 | Cok et al. |
| 2018/0013046 A1 | 1/2018 | Huang et al. |
| 2018/0017801 A1 | 1/2018 | Chang et al. |
| 2018/0019233 A1 | 1/2018 | Chang et al. |
| 2018/0040278 A1 | 2/2018 | Chu et al. |
| 2018/0061302 A1 | 3/2018 | Hu et al. |
| 2018/0087722 A1 | 3/2018 | Ooi et al. |
| 2018/0090058 A1 | 3/2018 | Chen et al. |
| 2018/0092173 A1 | 3/2018 | Wu et al. |
| 2018/0097033 A1 | 4/2018 | Ahmed et al. |
| 2018/0097157 A1 | 4/2018 | Simin et al. |
| 2018/0198029 A1 | 7/2018 | Munteanu et al. |

(56) References Cited

U.S. PATENT DOCUMENTS

| | | | |
|---|---|---|---|
| 2019/0019840 | A1 | 1/2019 | Thothadri et al. |
| 2019/0088820 | A1 | 3/2019 | Danesh et al. |
| 2019/0347994 | A1 | 11/2019 | Lin et al. |
| 2020/0083405 | A1 | 3/2020 | Choi et al. |
| 2020/0098307 | A1 | 3/2020 | Li et al. |
| 2020/0184884 | A1 | 6/2020 | Lau et al. |
| 2020/0225501 | A1* | 7/2020 | Bakin .............. G01B 11/2513 |
| 2021/0201771 | A1 | 7/2021 | Li et al. |
| 2021/0296528 | A1* | 9/2021 | Fujiwara .............. H01L 33/08 |

FOREIGN PATENT DOCUMENTS

| | | | |
|---|---|---|---|
| GB | 2327798 | A | 2/1999 |
| JP | 7049663 | A | 2/1995 |
| JP | H1093198 | A | 4/1998 |
| JP | H1174566 | A | 3/1999 |
| JP | 3005115 | B2 | 1/2000 |
| JP | 2001284641 | A | 10/2001 |
| JP | 2002100805 | A | 4/2002 |
| JP | 2002116741 | A | 4/2002 |
| JP | 2004079933 | A | 3/2004 |
| JP | 2007165611 | A | 6/2007 |
| JP | 2007294579 | A | 11/2007 |
| JP | 2008523637 | A | 7/2008 |
| JP | 2015521298 | A | 7/2015 |
| JP | 2018014475 | A | 1/2018 |
| JP | 2019012744 | A | 1/2019 |
| JP | 2019507905 | A | 3/2019 |
| KR | 980012751 | A | 4/1998 |
| KR | 101265727 | B1 | 5/2013 |
| TW | 227005 | B | 7/1994 |
| TW | 407253 | B | 10/2000 |
| TW | 418380 | B | 1/2001 |
| TW | 482991 | B | 4/2002 |
| TW | 483282 | B | 4/2002 |
| TW | 200603192 | A | 1/2006 |
| WO | 0070376 | A1 | 11/2000 |
| WO | 0152229 | A1 | 7/2001 |
| WO | 2007127849 | A2 | 11/2007 |
| WO | 2007127852 | A2 | 11/2007 |
| WO | 2010023921 | A1 | 3/2010 |
| WO | 2017073157 | A1 | 5/2017 |
| WO | 2017192667 | A1 | 11/2017 |

OTHER PUBLICATIONS

"1920×1080 Image Sample Structure, Digital Representation and Digital Timing Reference Sequences for Multiple Picture Rates", SMPTE 274M-2005, SMPTE, White Plains, New York, US, 2005, 29 pages.

"2114A 1024×4 Bit Static RAM", Component Data Catalog, Intel Corp., Santa Clara, CA, USA, 1982, 7 pages.

"Flip-Flops", CSE370, Lecture 14, https://studylib.net/doc/18055423/flip-flops, no date, pp. 1-17.

"Sony 3D", screen capture from video clip, 2009, 2 pages.

"Westar's Microdisplay Inspection System", Product Description, www.westar.com/mdis, Jan. 2000, 2 pages.

Amon, et al., "PTAT Sensors Based on SJFETs", 10th Mediterranean Electrotechnical Conference, MEleCon, vol. II, 2000, pp. 802-805.

Anderson, et al., "Holographic Data Storage: Science Fiction or Science Fact", Akonia Holographics LLC, presented at Optical Data Storage, 2014, 8 pages.

Armitage, et al., "Introduction to Microdisplays", John Wiley & Sons, 2006, pp. 182-185.

Baker, "CMOS Circuit Design, Layout, and Simulation", IEEE Press Series on Microelectronic Systems, John Wiley & Sons, Inc., Publication, 2010, pp. 614-616.

Campardo, et al., "VLSI-Design of Non-Volatile Memories", Springer, 2005, pp. 183-188.

Colgan, et al., "On-Chip Metallization Layers for Reflective Light Waves", Journal of Research Development, vol. 42, No. 3/4, May-Jul. 1998, pp. 339-345.

Dai, et al., "Characteristics of LCoS Phase-only spatial light modulator and its applications", Optics Communications vol. 238, especially section 3.2, 2004, pp. 269-276.

Drabik, "Optically Interconnected Parallel Processor Arrays", A Thesis, Georgia Institute of Technology, Dec. 1989, pp. 121-126.

Fuller, "Static Random Access Memory-SRAM", Rochester Institute of technology to Microelectronic Engineering, Nov. 18, 2016, pp. 1-39.

Hu, "Complementary MOS (CMOS) Technology", Feb. 13, 2009, pp. 198-200.

Jesacher, et al., "Broadband suppression of the zero diffraction order of an SLM using its extended phase modulation range", Optics Express, vol. 22, No. 14, Jul. 14, 2014, pp. 17590-17599.

Kang, et al., "Digital Driving of TN-LC for WUXGA LCOS Panel", Digest of Technical Papers, Society for Information Display, 2001, pp. 1264-1267.

Nakamura, et al., "Modified drive method for OCB LSD", Proceeding of the International Display Research Conference, Society for Information Display, Campbell, CA, US, 1997, 4 pages.

Ong, "Modern Mos Technology: Processes, Devices, and Design", McGraw-Hill Book Company, 1984, pp. 207-212.

Oton, et al., "Multipoint phase calibration for improved compensation of inherent wavefront distortion in parallel aligned liquid crystal on silicon display", Applied Optics, vol. 46, No. 23, Optical Society of America, 2007, pp. 5667-5679.

Pelgrom, et al., "Matching Properties of MOS Transistors", IEEE Journal of Solid-State Circuits, vol. 23, No. 5, Oct. 1989, 8 pages.

Potter, et al., "Optical correlation using a phase-only liquid crystal over silicon spatial light modulator", SPIE 1564 Opt. Info. Proc. Sys & Arch. III;, 1991, pp. 363-372.

Rabaey, et al., "Digital Integrated Circuits", A Design Perspective, Second Edition, Saurabh Printers Pvt. Ltd, 2016, pp. 138-140.

Rabaey, "The Devices Chapter 3", Jan. 18, 2002, pp. 121-124.

Robinson, et al., "Polarization Engineering for LCD Projection", John Wiley and Sons, Ltd., Chichester, England, 2005, pp. 121-123.

Sloof, et al., "An Improved WXGA LCOS Imager for Single Panel Systems", Proceedings of the Asia Symposium on Information Display, Society for Information Display, Campbell, CA, US, 2004, 4 pages.

Underwood, et al., "Evaluation of an nMOS VLSI array for an adaptive liquid-crystal spatial light modulator", IEEE Proc, v.133 PI.J. No., Feb. 1986, 15 pages.

Wang, "Studies of Liquid Crystal Response Time", University of Central Florida, Doctoral Dissertation, 2005, 128 pages.

Wu, "Discussion #9 MOSFETs", University of California at Berkeley College of Engineering Department of Electrical Engineering and Computer Sciences, Spring 2008, pp. 1-7.

U.S. Appl. No. 16/841,119, filed Apr. 6, 2020, Allowed.

* cited by examiner

MONOLITHIC INTEGRATION OF DIFFERENT LIGHT EMITTING STRUCTURES ON A SAME SUBSTRATE

CROSS REFERENCE TO RELATED APPLICATIONS

This application is a continuation of U.S. application Ser. No. 16/841,119, filed Apr. 6, 2020, which claims priority to and the benefit of U.S. Provisional Application No. 62/833,072, filed on Apr. 12, 2019, the disclosures of which are incorporated herein by reference in their entireties.

BACKGROUND OF THE DISCLOSURE

Aspects of the present disclosure generally relate to light emitting structures, such as the structures of light emitting elements used in various types of displays, and more specifically, to monolithically integrating light emitting structures that generate different colors of light on a same substrate.

As the number of light emitting elements (e.g., pixels) used in displays continues to increase to provide better user experience and to enable new applications, adding more and more of them becomes a challenge from both a design and manufacturing perspective. To achieve ever smaller light emitting elements in order to increase both count and density has made the potential use of small light-emitting diodes (LEDs) more attractive; however, effective and efficient techniques for making small LEDs in large numbers, high densities, and capable of producing the different colors (e.g., red, green, blue) needed for a color display are not widely available, and those that do exist tend to be cumbersome, time consuming, and costly. In addition, making use of these small LEDs in more sophisticated display architectures with more stringent requirements in terms of both performance and size, such as light field displays, becomes a rather difficult thing to do.

Accordingly, techniques and devices that enable effective and efficient design and fabrication of large numbers of small light emitting elements by monolithically integrating semiconductor structures that generate different colors of light on a same substrate (e.g., a single integrated semiconductor device) are desirable.

SUMMARY OF THE DISCLOSURE

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its purpose is to present some concepts of one or more aspects in a simplified form as a prelude to the more detailed description that is presented later.

In an aspect of the disclosure, a device for light generation is described having a substrate with one or more buffer layers made a material that includes GaN. The device also includes light emitting structures, which are epitaxially grown on a same surface of a top buffer layer of the substrate, where each light emitting structure has an active area parallel to the surface and laterally terminated, and where the active area of different light emitting structures is configured to directly generate a different color of light. The device also includes a p-doped layer disposed over the active area of each light emitting structure and made of a p-doped material that includes GaN. The device may be part of a light field display and may be connected to a backplane of the light field display.

BRIEF DESCRIPTION OF THE DRAWINGS

The appended drawings illustrate only some implementation and are therefore not to be considered limiting of scope.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known components are shown in block diagram form in order to avoid obscuring such concepts.

As mentioned above, with a need for ever increasing numbers of light emitting elements (e.g., pixels) in displays to provide better user experience and to enable new applications, adding more and more of them becomes a challenge. To achieve ever smaller light emitting elements in order to increase both count and density has made the potential use of small LEDs (e.g., micro-LEDs) more attractive, but the few techniques for making small LEDs in large numbers, high densities, and capable of producing the different colors (e.g., red, green, blue) are currently cumbersome, time consuming, and costly. More sophisticated display architectures, such as those for light field displays, may benefit from the use of small LEDs, but the requirements of such displays makes the implementation of small LEDs a rather difficult thing to do. Accordingly, new techniques and devices that allow for the monolithic integrating of large numbers of small light emitting structures that generate different colors of light on a same substrate (e.g., a single integrated semiconductor device) are desirable.

This disclosure, in connection with the figures described below, provides examples of such techniques and devices. For example, FIGS. 1-4B describe general information about examples of displays in which monolithically integrated light emitting structures may be implemented, while FIGS. 5A-9B describe various aspects of examples of such monolithically integrated light emitting structures.

As used in this disclosure, the term "light emitting structure" and "light emitting element" may be used interchangeably, where the term "light emitting structure" may be used to describe a structural arrangement (e.g., materials, layers, configuration) of a single component configured to produce light of a particular color, and the terms a "light emitting element," "light emitter," or simply "emitter" may be used to more generally refer to the single component.

Figure 1:
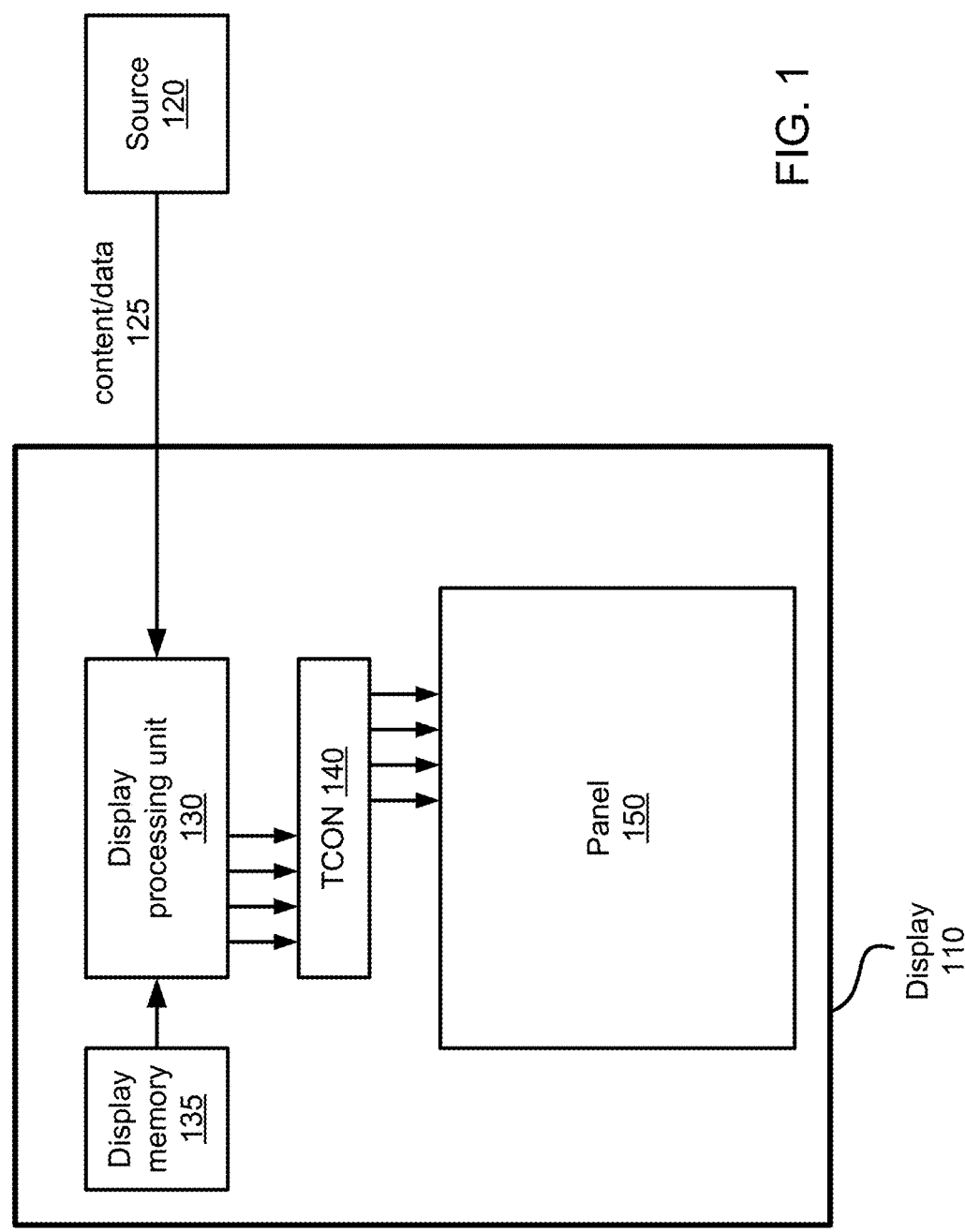
FIG. 1 illustrates an example of a display and a source of content for the display, in accordance with aspects of this disclosure.

FIG. 1 shows a diagram 100 that illustrates an example of a display 110 that receives content/data 125 (e.g., image content, video content, or both) from a source 120. The display 110 may include one or more panels 150 (one is shown), where each panel 150 in the display 110 is a light emitting panel or a reflective panel. The panel may include not only light emitting or light reflecting elements in some arrangement or array, but may also include a backplane for driving the light emitting or light reflecting elements. When light emitting panels are used they can include multiple light emitting elements (see e.g., light emitting elements 220 in FIG. 2A). These light emitting elements can be LEDs made from one or more semiconductor materials. The LEDs can be an inorganic LEDs. The LEDs can be, for example, micro-LEDs, also referred to as microLEDs, mLEDs, or μLEDs. Other display technologies from which the light emitting elements can be made include liquid crystal display (LCD) technology or organic LED (OLED) technology. Moreover, LEDs that produce different colors of light may be monolithically integrated into a same semiconductor substrate for efficient fabrication.

The display 110 can have capabilities that include ultra-high-resolution capabilities (e.g., support for resolutions of 8K and higher), high dynamic range (contrast) capabilities, or light field capabilities, or a combination of these capabilities. When the display 110 has light field capabilities and can operate as a light field display, the display 110 can include multiple picture elements (e.g., super-raxels), where each picture element has a respective light steering optical element and an array of light emitting elements (e.g., sub-raxels) monolithically integrated on a same semiconductor substrate, and where the light emitting elements in the array are arranged into separate groups (e.g., raxels) to provide multiple views supported by the light field display (see e.g., FIGS. 2B-3). Moreover, for light field displays, the numbers of light emitting elements and their density may be orders of magnitude greater than for conventional displays, even high-resolution ones.

The source 120 may provide the content/data 125 to a display processing unit 130 integrated within the display 110. The display processing unit 130 may be configured to modify an image or video content in the content/data 125 for presentation by the display 110. A display memory 135 is also shown that stores information used by the display processing unit 130 for handing the image or video content. The display memory 135, or a portion of it, can be integrated with the display processing unit 130. The set of tasks that can be performed by the display processing unit 130 may include tasks associated with color management, data conversion, and/or multiview processing operations for light field applications. The display processing unit 130 may provide processed content/data to a timer controller (TCON) 140, which in turn provides the appropriate display information to the panel 150. At mentioned above, the panel 150 (also referred to as a display panel) can include a backplane for driving light emitting or light reflecting elements in the panel 150.

Figure 2A:
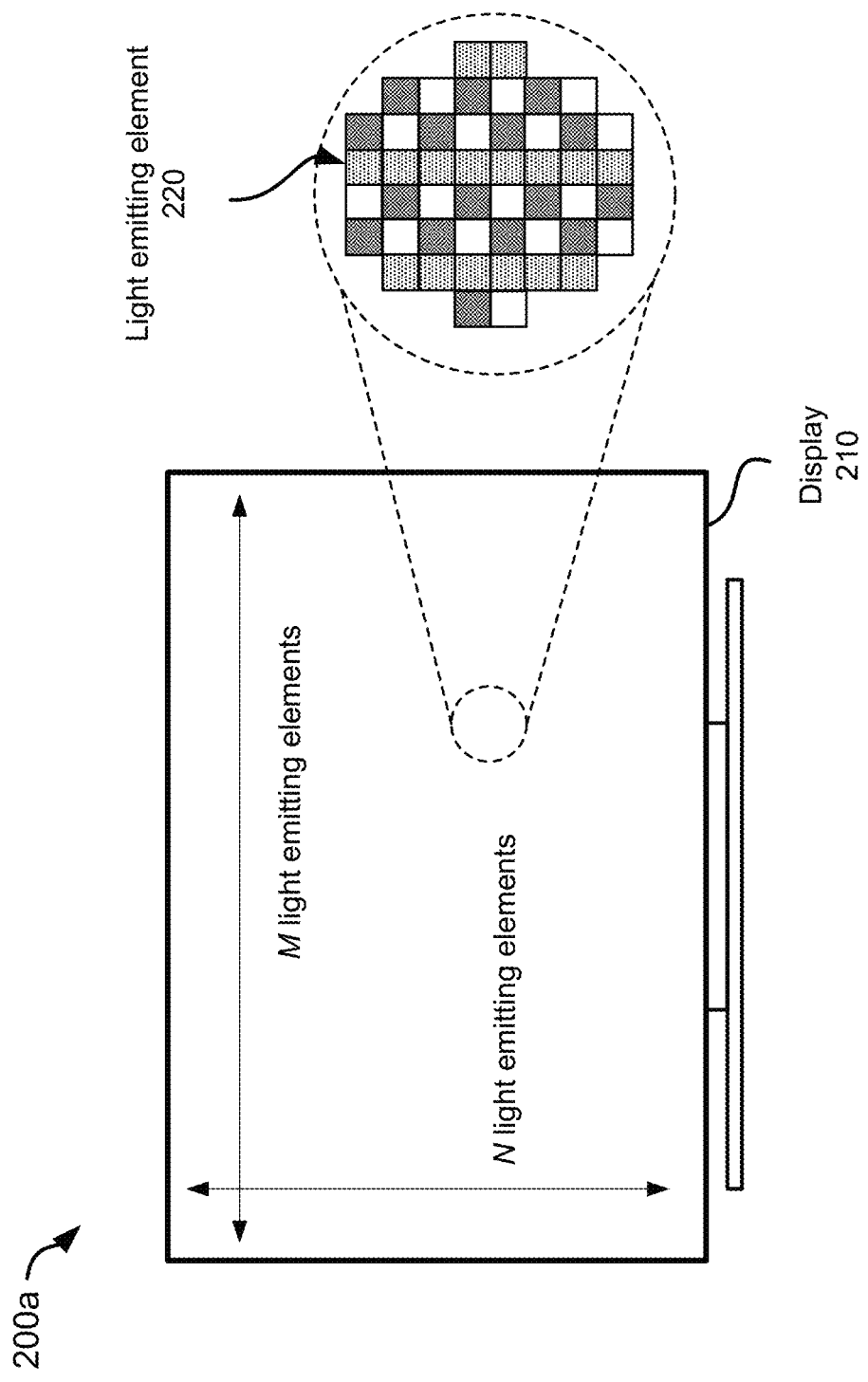
FIG. 2A illustrates an example of a display having multiple pixels, in accordance with aspects of this disclosure.

A diagram 200a in FIG. 2A shows a display 210 having multiple light emitting elements 220, typically referred to as pixels or display pixels. As mentioned above, these light emitting elements may be made of certain structures (e.g., semiconductor structures) that allow for light emitting elements that produce different colors to be monolithically integrated on a same substrate. The light emitting elements 220, although shown separated from each other for illustration purposes, are generally formed in an array and adjacent to each other to provide for a higher resolution of the display 210. The display 210a may be an example of the display 110 in the diagram 100.

In the example shown in FIG. 2A, the light emitting elements 220 can be organized or positioned into an N×M array, with N being the number of rows of pixels in the array and M being the number of columns of pixels in the array. An enlarged portion of such an array is shown to the right of the display 210. For small displays, examples of array sizes can include N≥10 and M≥10 and N≥100 and M≥100. For larger displays, examples of array sizes can include N≥500 and M≥500, N≥1,000 and M≥1,000, N≥5,000 and M≥5,000, N≥ and M≥10,000, with even larger array sizes also possible.

Although not shown, the display 210 may include, in addition to the array of light emitting elements 220, a backplane for driving the array. The backplane may be configured to enable low power consumption and high bandwidth operation.

Figure 2B:
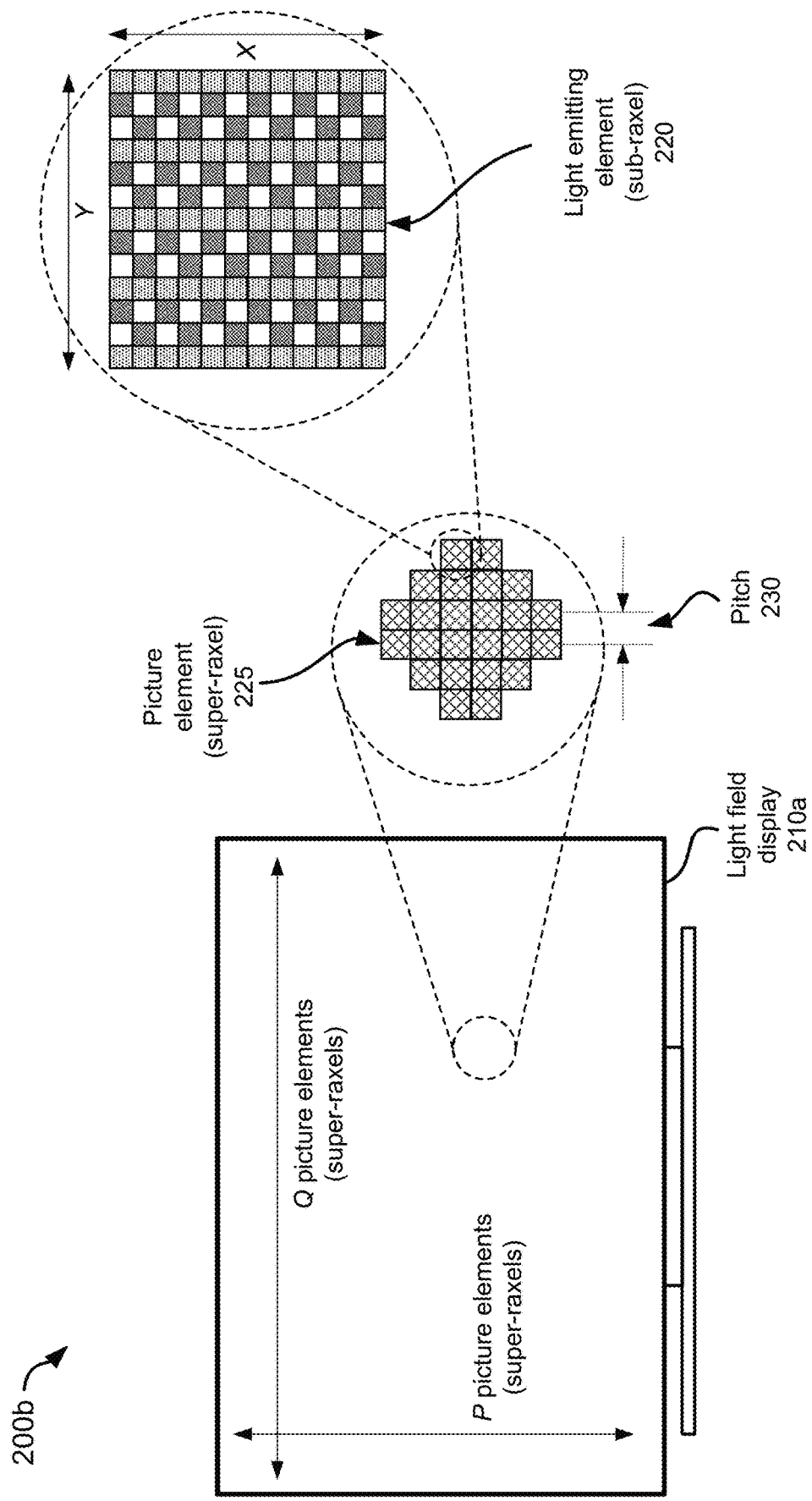
FIGS. 2B and 2C illustrate examples of a light field display having multiple picture elements, in accordance with aspects of this disclosure.

A diagram 200b in FIG. 2B shows a light field display 210a having multiple picture elements or super-raxels 225. In this disclosure, the term "picture element" and the term "super-raxel" can be used interchangeably to describe a similar structural unit in a light field display. The light field display 210a may be an example of the display 110 in the diagram 100 having light field capabilities. The light field display 210a can be used for different types of applications and its size may vary accordingly. For example, a light field display 210a can have different sizes when used as displays for watches, near-eye applications, phones, tablets, laptops, monitors, televisions, and billboards, to name a few. Accordingly, and depending on the application, the picture elements 225 in the light field display 210a can be organized into arrays, grids, or other types of ordered arrangements of different sizes. The picture elements 225 of the light field display 210a can be distributed over one or more display panels.

In the example shown in FIG. 2B, the picture elements 225 can be organized or positioned into an P×Q array, with P being the number of rows of picture elements in the array and Q being the number of columns of picture elements in the array. An enlarged portion of such an array is shown to the right of the light field display 210a. For small displays, examples of array sizes can include $P \geq 10$ and $Q \geq 10$ and $P \geq 100$ and $Q \geq 100$. For larger displays, examples of array sizes can include $P \geq 500$ and $Q \geq 500$, $P \geq 1,000$ and $Q \geq 1,000$, $P \geq 5,000$ and $Q \geq 5,000$, and $P \geq 10,000$ and $Q \geq 10,000$.

Each picture element 225 in the array has itself an array or grid of light emitting elements 220 or sub-raxels (as shown further to the right). In other words, each picture element 225 includes multiple light emitting elements 220, and each of those light emitting elements 225 includes a respective light emitting structure. When the picture elements 225 include as light emitting elements 220 different LEDs on a same semiconductor substrate that produce different colors of light, e.g., red (R) light, green (G) light, and blue (B) light, the light field display 210a can be said to be made from monolithically integrated RGB LED super-raxels.

Each of the picture elements 225 in the light field display 210a, including its corresponding light steering optical element 215 (an integral imaging lens illustrated in a diagram 200c in FIG. 2C), can represent a minimum picture element size limited by display resolution. In this regard, an array or grid of light emitting elements 220 of a picture element 225 can be smaller than the corresponding light steering optical element 215 for that picture element. In practice, however, it is possible for the size of the array or grid of light emitting elements 220 of a picture element 225 to be similar to the size of the corresponding light steering optical element 215 (e.g., the diameter of a microlens or lenslet), which in turn can be similar or the same as a pitch 230 between picture elements 225.

As mentioned above, an enlarged version of an array of light emitting elements 220 for a picture element 225 is shown to the right of the diagram 200b. The array of light emitting elements 220 can be an X×Y array, with X being the number of rows of light emitting elements 220 in the array and Y being the number of columns of light emitting elements 220 in the array. Examples of array sizes can include $X \geq 5$ and $Y \geq 5$, $X \geq 8$ and $Y \geq 8$, $X \geq 9$ and $Y \geq 9$, $X \geq 10$ and $Y \geq 10$, $X \geq 12$ and $Y \geq 12$, $X \geq 20$ and $Y \geq 20$, and $X \geq 25$ and $Y \geq 25$. In an example, a X×Y array may be a 9×9 array including 81 light emitting elements or sub-raxels 220.

For each picture element 225, the light emitting elements 220 in the array can include separate and distinct groups of light emitting elements 220 (see e.g., group of light emitting elements 260 in FIG. 2D) that are allocated or grouped (e.g., logically grouped) based on spatial and angular proximity and that are configured to produce the different light outputs (e.g., directional light outputs) that contribute to produce light field views provided by the light field display 210a to a viewer. The grouping of sub-raxels or light emitting elements 220 into raxels need not be unique. For example, during assembly or manufacturing, there can be a mapping of sub-raxels into particular raxels that best optimize the display experience. A similar re-mapping can be performed by the display once deployed to account for, for example, aging of various parts or elements of the display, including variations in the aging of light emitting elements of different colors and/or in the aging of light steering optical elements. In this disclosure, the term "groups of light emitting elements" and the term "raxel" can be used interchangeably to describe a similar structural unit in a light field display. The light field views produced by the contribution of the various groups of light emitting elements or raxels can be perceived by a viewer as continuous or non-continuous views. As mentioned above, the structures of the various light emitting elements that generate light of different colors may all be monolithically integrated on a same semiconductor substrate, which is described in more detail below.

Each of the groups of light emitting elements 220 in the array of light emitting elements 220 (far right of the diagram 200b in FIG. 2B) includes light emitting elements that produce at least three different colors of light (e.g., red light, green light, blue light, and perhaps also white light). In one example, each of these groups or raxels includes at least one light emitting element 220 that produces red light, one light emitting element 220 that produces green light, and one light emitting element 220 that produce blue light. Alternatively, at least one light emitting element 220 that produces white light may also be included.

Figure 2C:
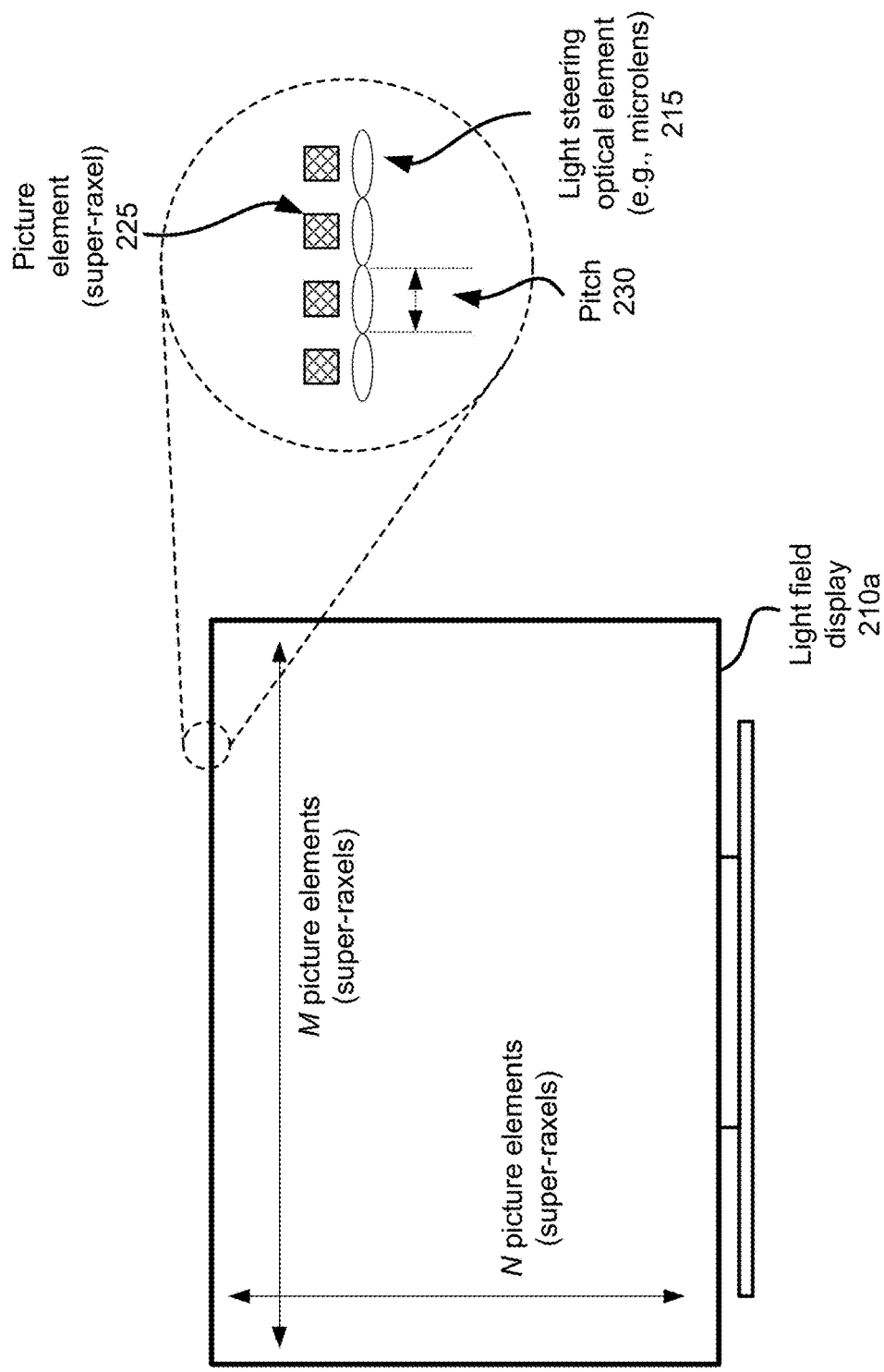

In FIG. 2C, a diagram 200c shows another example of the light field display 210a illustrating an enlarged view of a portion of an array of picture elements 225 with corresponding light steering optical elements 215 as described above. The pitch 230 can represent a spacing or distance between picture elements 225 and can be about a size of the light steering optical element 215 (e.g., size of a microlens or lenslet).

Figure 2D:
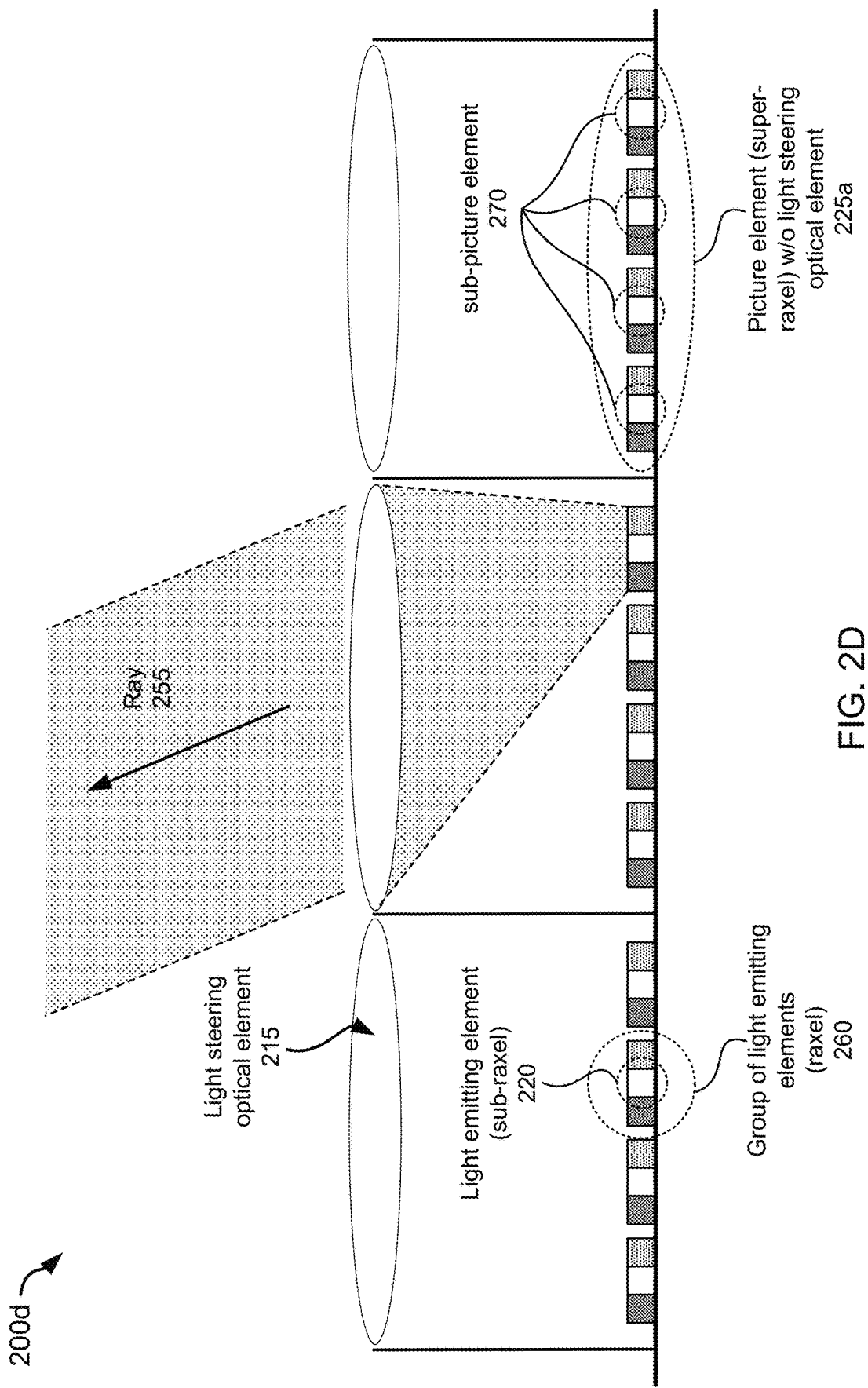
FIG. 2D illustrates an example of a cross-sectional view of a portion of a light field display, in accordance with aspects of this disclosure.

A diagram 200d in FIG. 2D shows a cross-sectional view of a portion of a light field display (e.g., the light field display 210a) to illustrate some of the structural units described in this disclosure for when the display 110 in FIG. 1 is configured as a light field display. For example, the diagram 200d shows three adjacent picture elements or super-raxels 225a, each having a corresponding light steering optical element 215. In this example, the light steering optical element 215 can be considered separate from the picture element 220a but in other instances the light steering optical element 215 can be considered to be part of the picture element.

As shown in FIG. 2D, each picture element 225a includes multiple light emitting elements 220 (e.g., multiple sub-raxels), where several light emitting elements 220 (e.g., several sub-raxels) of different types can be grouped together into the group 260 (e.g., into a raxel). A group or raxel can produce various components that contribute to a particular ray element 255 as shown by the right-most group or raxel in the middle picture element 225a. Is it to be understood that the ray elements 255 produced by different groups or raxels in different picture elements can contribute to a view perceived by viewer away from the light field display.

An additional structural unit described in FIG. 2D is the concept of a sub-picture element 270, which represents a grouping of the light emitting elements 220 of the same type (e.g., produce the same color of light) of the picture element 225a.

FIG. 2D also supports the concept of having various light emitting elements 220 (or at least their respective structures configured to produce light) configured to produce different colors of light, whether in a picture element 225 (super-raxel), a group 260 (raxel), or a sub-picture element 270, monolithically integrated on a same or single semiconductor substrate.

Figure 3:
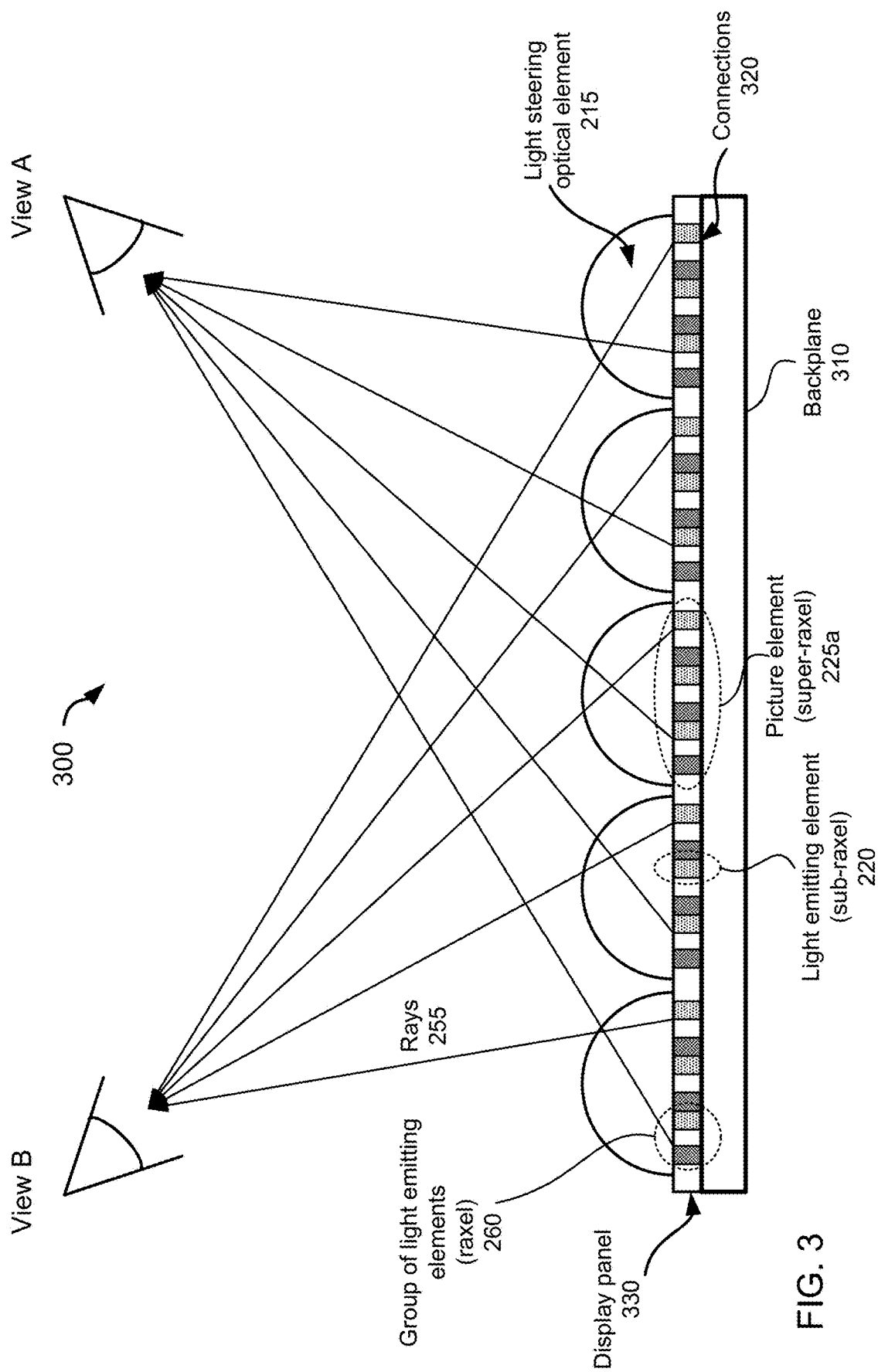
FIG. 3 illustrates an example of a backplane integrated with an array of light emitting elements, in accordance with aspects of this disclosure.

A diagram 300 in FIG. 3 illustrates an example of a backplane integrated with an array of light emitting elements. The diagram 300 shows a cross-sectional view, similar to that in the diagram 200*d* in FIG. 2D. The diagram 300 shows the light emitting optical elements (sub-raxels) 220, the groups of light emitting elements (raxels) 260, the picture elements (super-raxels) 225*a*, and the light steering optical elements 215. Also shown is a representation of how various rays 255 from different picture elements may contribute to produce different views, such as view A and view B. Moreover, the light emitting elements 220 of the picture elements 225*a* form a larger array 330 (e.g., a display panel) that is then connected to a backplane 310 through connections 320, which in turn is configured to drive each of the light emitting elements 220.

Figure 4A:
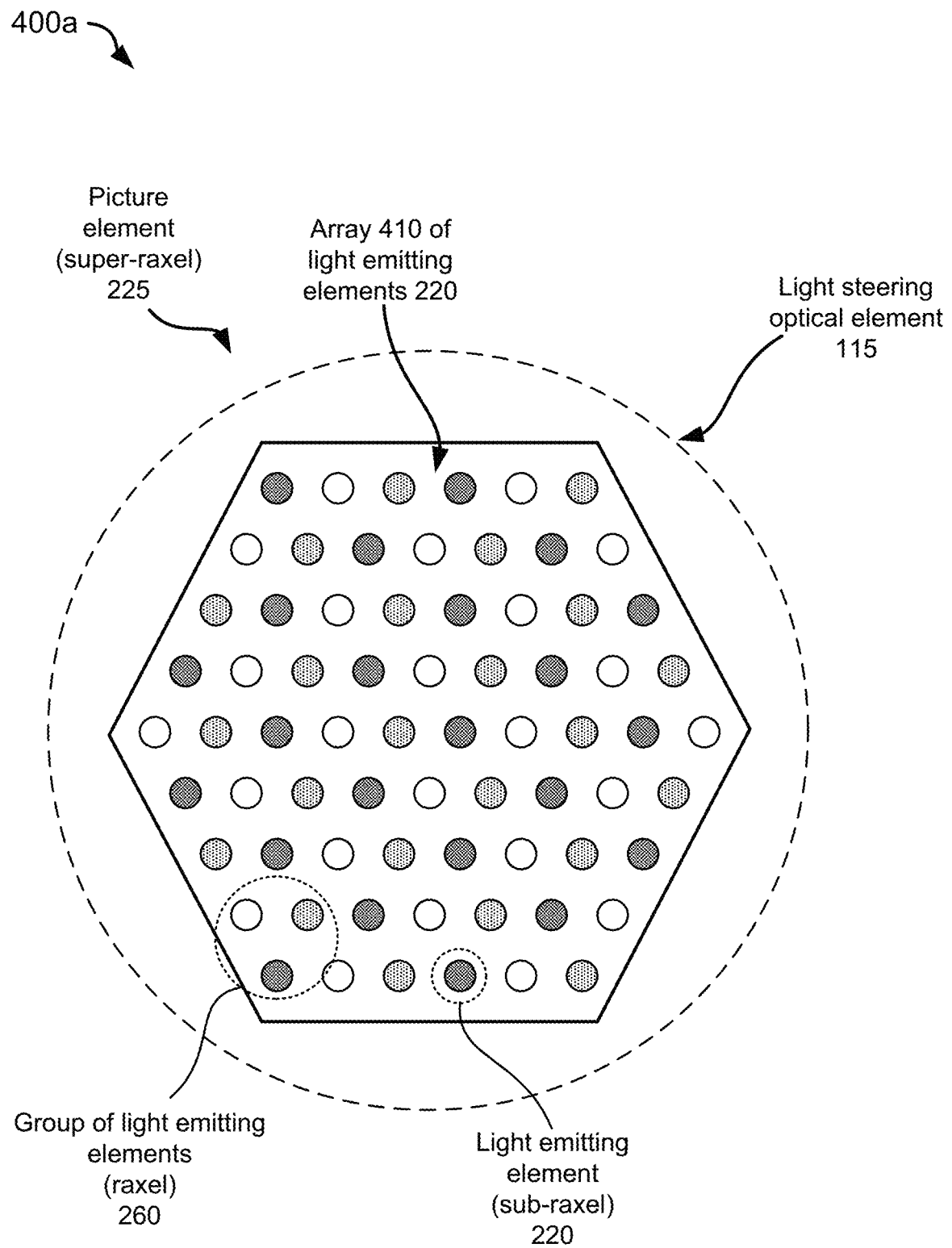
FIG. 4A illustrates an example of an array of light emitting elements in a picture element, in accordance with aspects of this disclosure.

FIG. 4A shows a diagram 400*a* describing various details of one implementation of a picture element 225. For example, the picture element 225 (e.g., a super-raxel) has a respective light steering optical element 215 (shown with a dashed line) and includes an array or grid 410 of light emitting elements 220 (e.g., sub-raxels) monolithically integrated on a same semiconductor substrate. The light steering optical element 215 can be of the same or similar size as the array 410, or could be slightly larger than the array 410 as illustrated. It is to be understood that some of the sizes illustrated in the figures of this disclosure have been exaggerated for purposes of illustration and need not be considered to be an exact representation of actual or relative sizes.

The light emitting elements 220 in the array 410 include different types of light emitting elements to produce light of different colors and are arranged into separate groups 260 (e.g., separate raxels) that provide different contributions to the multiple views produced by a light field display. Each of the light emitting elements 220 in the array 410 can be monolithically integrated on a same semiconductor substrate.

As shown in FIG. 4A, the array 410 has a geometric arrangement to allow adjacent or close placement of two or more picture elements. The geometric arrangement can be one of a hexagonal shape (as shown in FIG. 4A), a square shape, or a rectangular shape.

Although not shown, the picture element 225 in FIG. 4A can have corresponding electronic means (e.g., in a backplane) that includes multiple driver circuits configured to drive the light emitting elements 220 in the picture element 225.

Figure 4B:
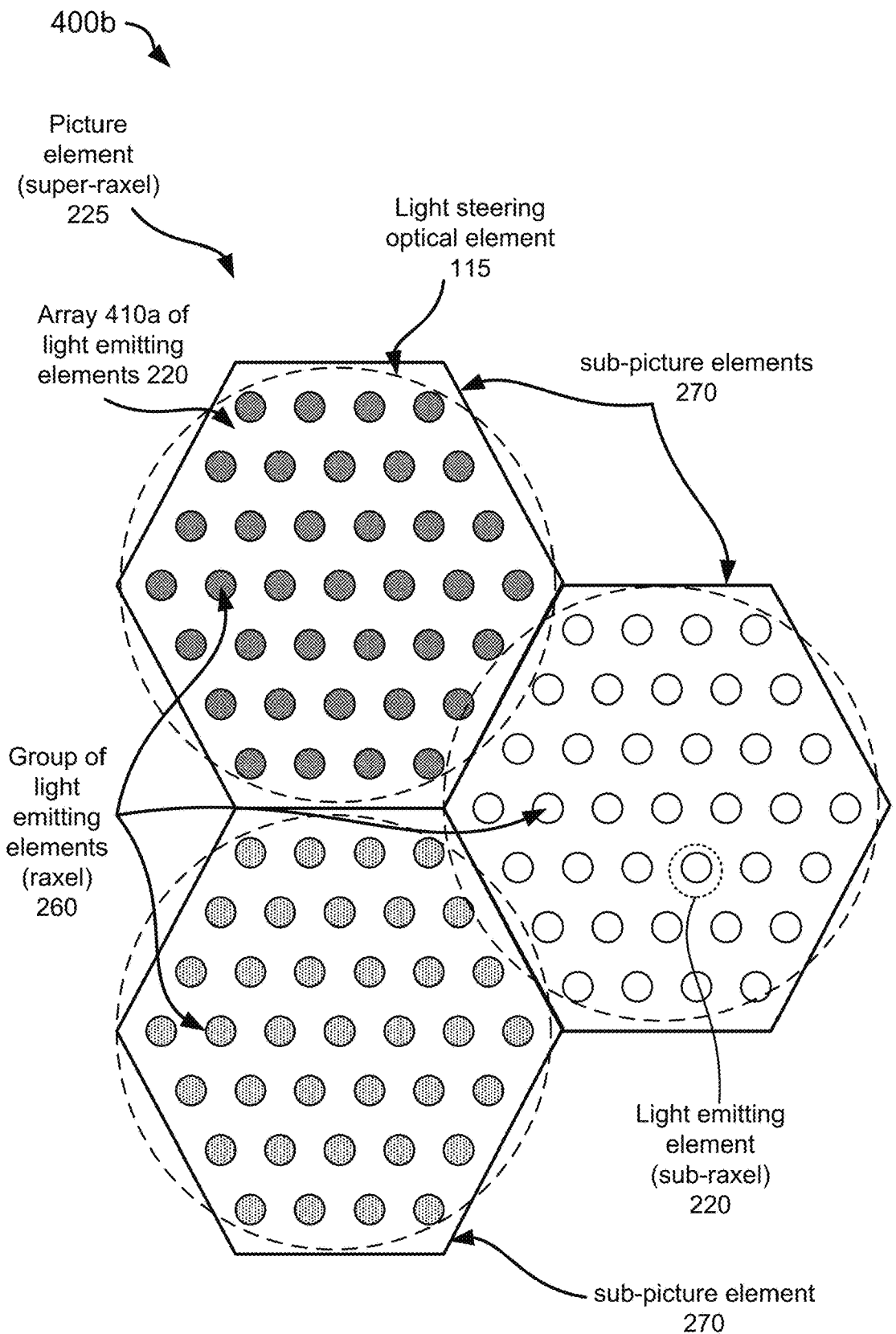
FIG. 4B illustrates an example of a picture element with sub-picture elements, in accordance with aspects of this disclosure.

FIG. 4B shows a diagram 400*b* describing various details of another implementation of a picture element 225. For example, the picture element 225 (e.g., a super-raxel) in FIG. 4B includes multiple sub-picture elements 270 monolithically integrated on a same semiconductor substrate. Each sub-picture element 270 has a respective light steering optical element 215 (shown with a dashed line) and includes an array or grid 410*a* of light emitting elements 220 (e.g., sub-raxels) that produce the same color of light. The light steering optical element 215 can be of the same or similar size as the array 410*a*, or could be slightly larger than the array 410*a* as illustrated. For the picture element 225, the light steering optical element 215 of one of the sub-picture elements 270 is configured to optimize the chromatic dispersion for a color of light produced by the light emitting elements 220 in that sub-picture element 720. Moreover, the light steering optical element 215 can be aligned and bonded to the array 410*a* of the respective sub-picture element 270.

The light emitting elements 220 of the sub-picture elements 720 are arranged into separate groups 260 (e.g., raxels). As illustrated by FIG. 4B, in one example, each group 260 can include collocated light emitting elements 220 from each of the sub-picture elements 270 (e.g., same position in each sub-picture element). As mentioned above, however, the mapping of various light emitting elements 220 to different groups 260 can be varied during manufacturing and/or operation. Each of the light emitting elements 220 in the various sub-picture elements 270 can be monolithically integrated on a same semiconductor substrate.

As shown in FIG. 4B, the array 410*a* has a geometric arrangement to allow adjacent placement of two or more sub-picture elements. The geometric arrangement can be one of a hexagonal shape (as shown in FIG. 4B), a square shape, or a rectangular shape.

Although not shown, the picture element 225 in FIG. 4B can have corresponding electronic means (e.g., in a backplane) that includes multiple driver circuits configured to drive the light emitting elements 220 in the picture element 225. In some examples, one or more common driver circuits can be used for each of the sub-picture elements 270.

As mentioned above, FIGS. 1-4B describe general information about examples of displays in which monolithically integrated light emitting structures (e.g., the structures of the light emitting elements 220) may be implemented. The description of FIGS. 5A-9B below provide details regarding various aspects of examples of such monolithically integrated light emitting structures.

Figure 5A:
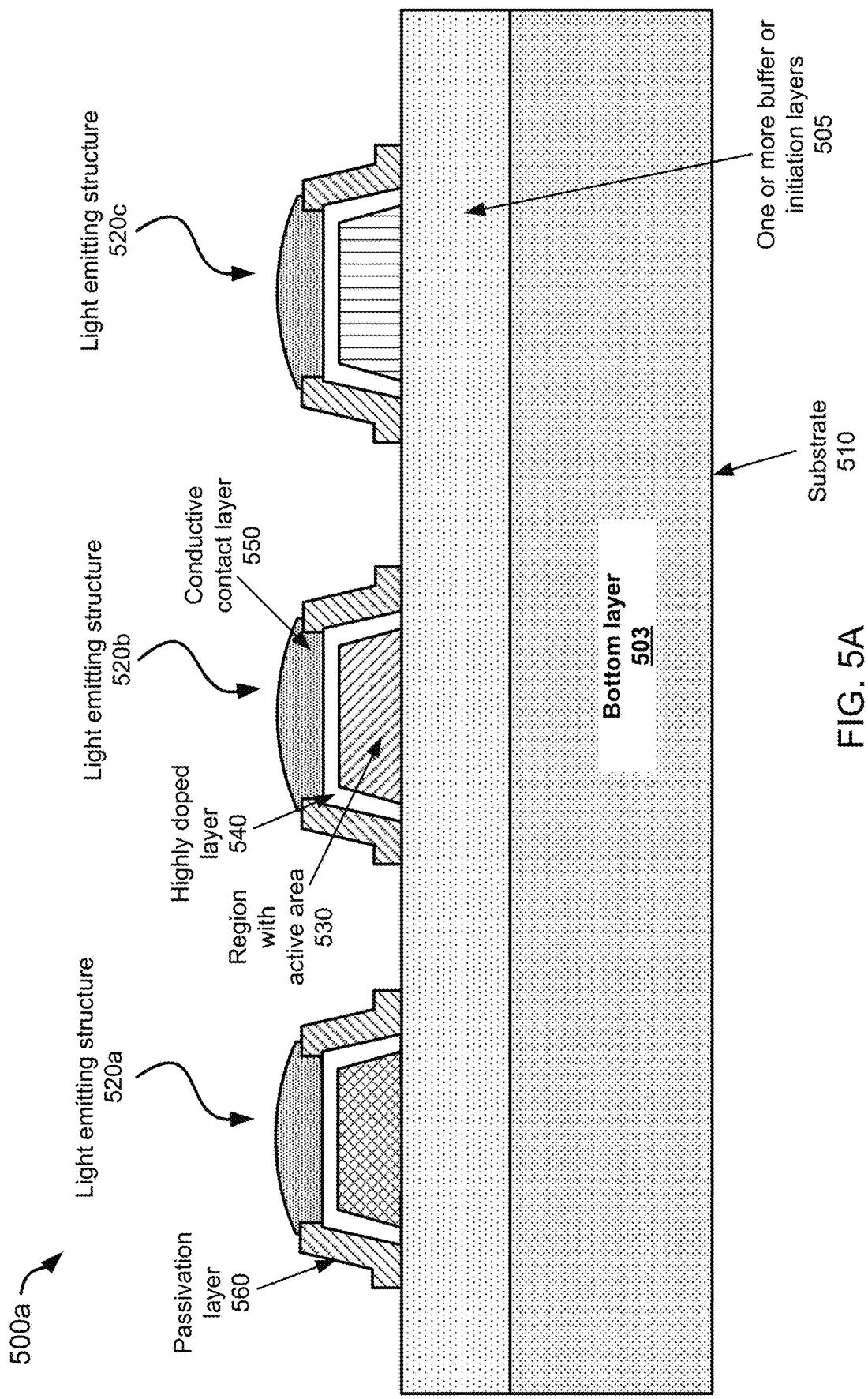
FIG. 5A illustrates a cross sectional view of an example of multiple light emitting structures monolithically integrated on a substrate, in accordance with aspects of this disclosure.

A diagram 500*a* in FIG. 5A illustrates a cross sectional view of an example in which light emitting structures 520*a*, 520*b*, and 520*c* are monolithically integrated on a substrate 510 (e.g., a semiconductor substrate). The substrate 510 may part of a device and may be made of multiple layers. In one example, the substrate 510 may include a bottom layer 503 (e.g. a layer made of sapphire) and one or more buffer or initiation layers 505 disposed over the bottom layer. The buffer layers 505 may include, for example, a first buffer layer 505 made of undpoded GaN and a second buffer layer 505 made of n-doped GaN, the latter of the two forming a top layer of the substrate 510. In some examples, the second buffer layer 505 may be thicker than the first buffer layer 505. Although the bottom layer of the substrate 510 need not be a semiconductor layer, the substrate 510 may be referred to as a semiconductor substrate since one or more of the top layers (e.g., the buffer or initiation layers 505) are semiconductor layers.

On a top surface of the substrate 510 (e.g., on a surface of the top buffer layer 505), in an optional example, a dielectric (not shown) may be deposited that defines the placement or positioning of the various light emitting structures 520*a*, 520*b*, and 520*c* to be grown. In such an example, the dielectric may be used to configure or arrange the light emitting structures 520 in the types of implementations described above in connection with FIGS. 2A, 2B, 2D, 3, 4A, and 4B.

The light emitting structure 520*a* may be configured to be part of or correspond to a light emitting element (e.g., light emitting element 220) that produces a first color of light, while the light emitting structures 520*b* and 520*c* may be configured to be part of or correspond to light emitting elements that produce a second color of light and a third color of light, respectively. Although not shown, other light emitting structures may also be included to produce additional colors of light.

Additional details of the layers, assembly, or configuration of a light emitting structure are provided in the diagram 500a of FIG. 5A in connection with the light emitting structure 520b shown in the middle. For example, a light emitting structure, which again may be part of or may correspond to a light emitting element, may include an epitaxially grown region 530 having an active area (e.g., an area that is used to generate the light), a highly doped layer 540 (e.g., made of a p++ doped material) deposited over the region 530, and a conductive contact layer 550 (e.g., metal or transparent conductor, also referred to as p-contact or p-contact layer) deposited over the highly doped layer 540. There may also be a passivation layer 560 deposited over the sides of the highly doped layer 540 (and possibly partially over the top of the highly doped layer 540). The active area in the region 530 may include at least one quantum well, whether in the form of individual quantum well structures or multiquantum well (MQW) structures within the region 530. Additionally or alternatively, the active area in the region 530 may include one or more rare earths, the choice of rare earth depending on the color of light to be generated. It is to be understood that the light emitting structures 520a and 520b are similarly constructed, however, each may have a different region 530 (and thus a different active area) to produce different colors of light. The light emitting structures 520a, 520b, and 520c are therefore considered to be monolithically integrated on the single substrate 510.

In this example, the conductive contact layer 550 only covers a top portion of the highly doped layer 540. This may be achieved by depositing the passivation layer 560 before the conductive contact layer 550, for example.

The sides of the light emitting structures 520a, 520b, and 520c may be faceted, that is, may not be vertical but have instead an angle or slant. This is reflected in the configuration of the sides or sidewalls of the region 530, the highly doped layer 540, and the passivation layer 560.

Figure 5B:
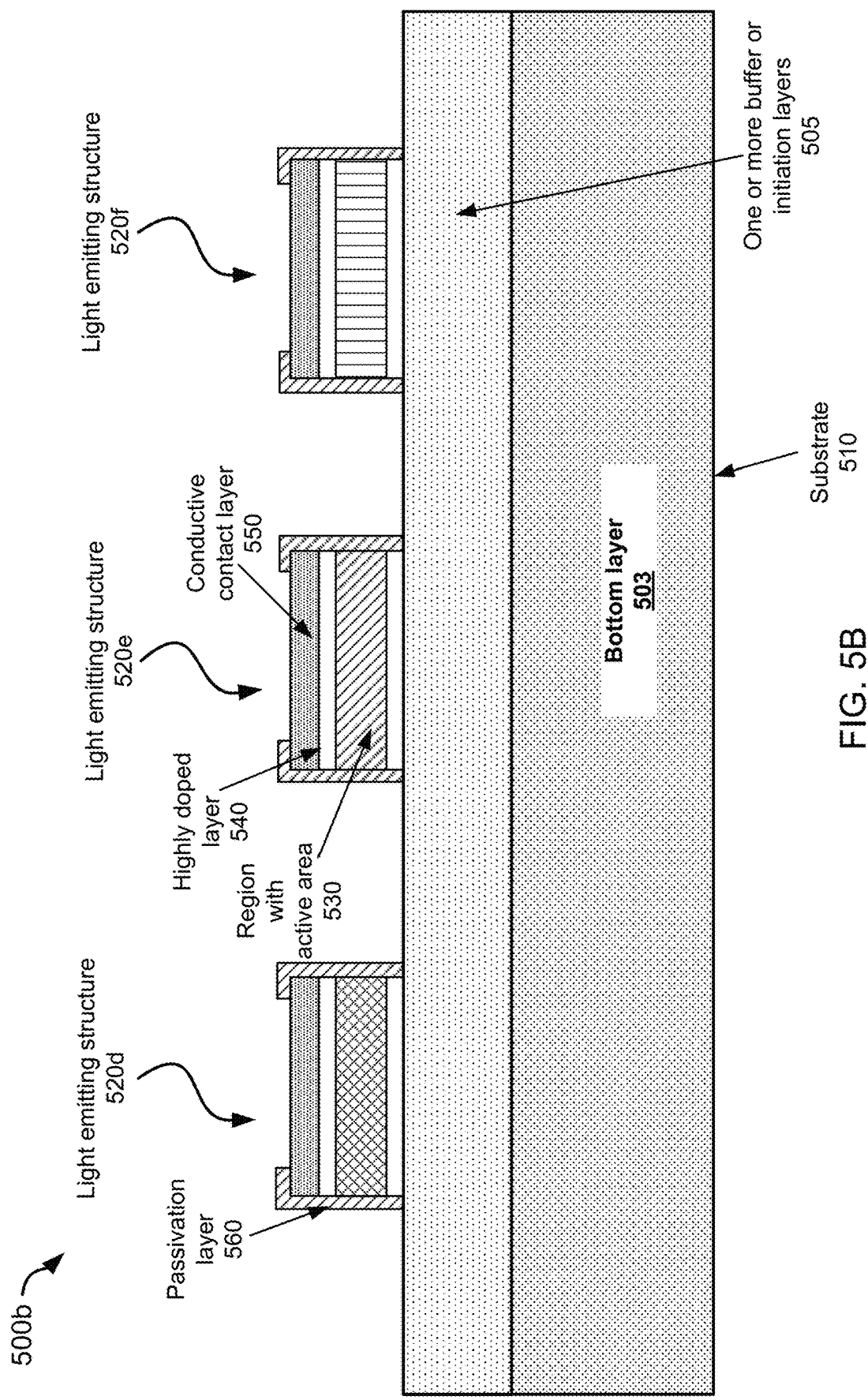
FIG. 5B illustrates a cross sectional view of another example of multiple light emitting structures monolithically integrated on a substrate, in accordance with aspects of this disclosure.

A diagram 500b in FIG. 5B illustrates a cross sectional view of another example in which light emitting structures 520e, 520d, and 520f are monolithically integrated on the substrate 510 (e.g., a semiconductor substrate). The substrate 510 may be part of a device and may be the same or similar to the one shown in the diagram 500a in FIG. 5A, and may include the bottom layer 503 and the one or more buffer or initiation layers 505. The various light emitting structures 520d, 520e, and 520f may be grown in particular positions or places by using different semiconductor fabrication techniques, allowing the light emitting structures to be configured or arranged in the types of implementations described above in connection with FIGS. 2A, 2B, 2D, 3, 4A, and 4B.

The light emitting structure 520d may be configured to be part of or correspond to a light emitting element (e.g., light emitting element 220) that produces a first color of light, while the light emitting structures 520e and 520f may be configured to be part of or correspond to light emitting elements that produce a second color of light and a third color of light, respectively. Although not shown, other light emitting structures may also be included to produce additional colors of light.

Additional details of the layers, assembly, or configuration of a light emitting structure are provided in the diagram 500b of FIG. 5B in connection with the light emitting structure 520e shown in the middle. For example, a light emitting structure, which again may be part of or may correspond to a light emitting element, may include the epitaxially grown region 530 having an active area, the highly doped layer 540, and the conductive contact layer 550. There may also be a passivation layer 560 deposited over the sides of the light emitting structure (and possibly partially over the top). The active area in the region 530 may include at least one quantum well, whether in the form of individual quantum well structures or multiquantum well (MQW) structures within the region 530. Additionally or alternatively, the active area in the region 530 may include one or more rare earths, the choice of rare earth depending on the color of light to be generated. It is to be understood that the light emitting structures 520d and 520f are similarly constructed, however, each may have a different region 530 (and thus a different active area) to produce different colors of light. The light emitting structures 520d, 520e, and 520f are therefore considered to be monolithically integrated on the single substrate 510. The sides or sidewalls of the light emitting structures 520d, 520e, and 520f may be vertical, which may be accomplished by different semiconductor fabrication techniques and in accordance with the processes used to make the structures.

Figure 6A:
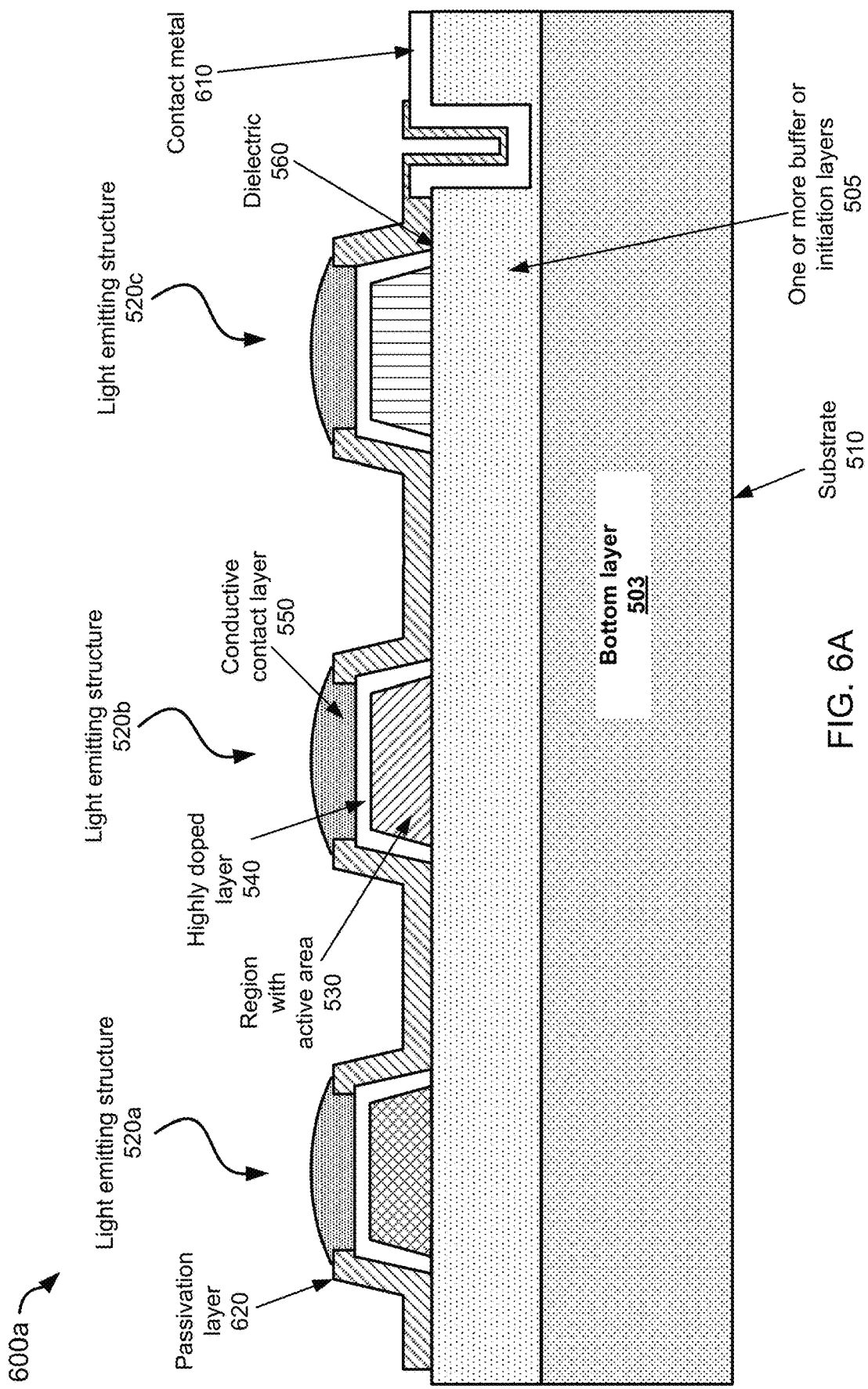
FIG. 6A illustrates a cross sectional view of an example of a device with multiple light emitting structures, in accordance with aspects of this disclosure.
Figure 6B:
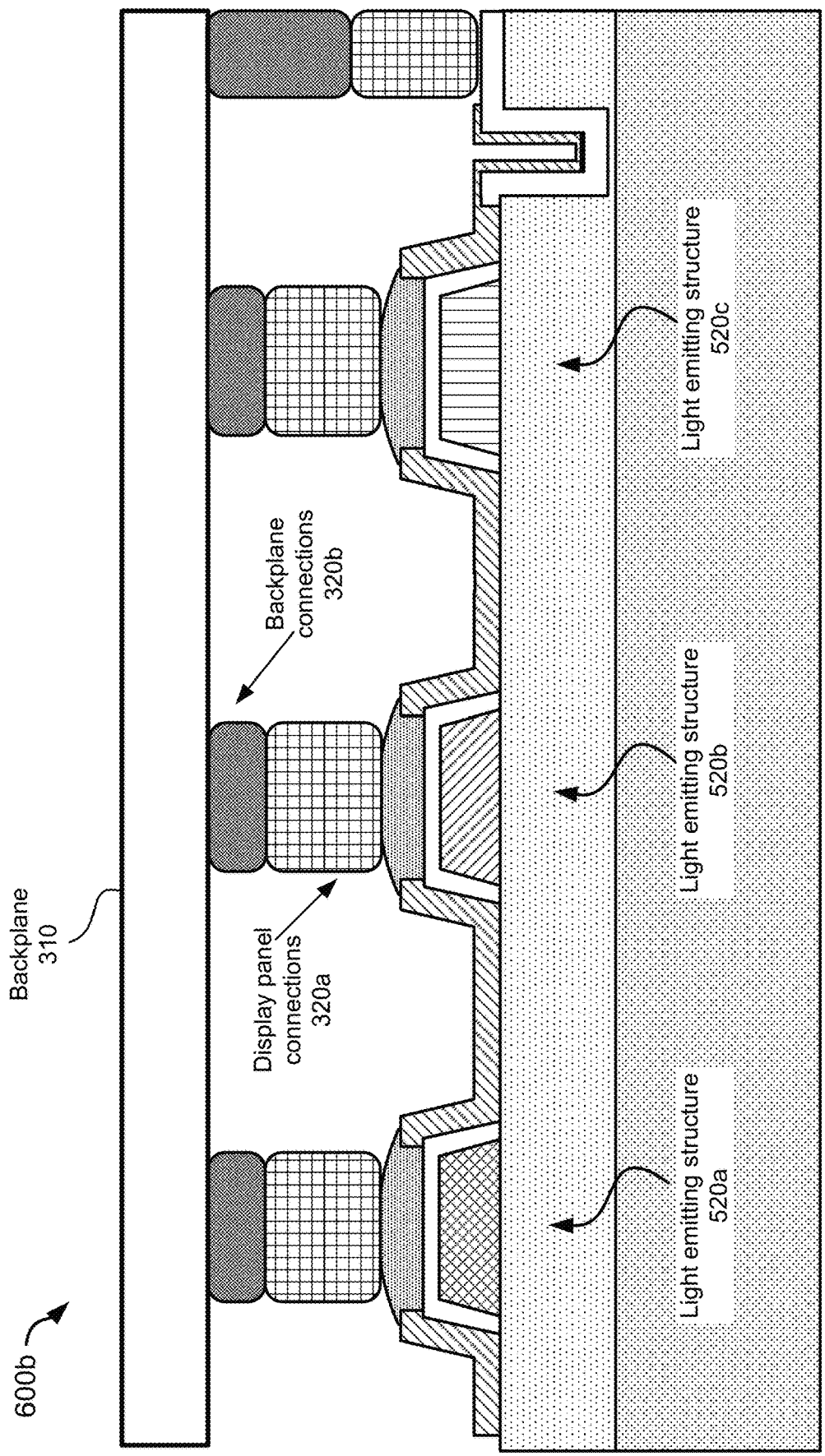
FIG. 6B illustrates a cross sectional view of the device of FIG. 6A connected to a backplane, in accordance with aspects of this disclosure.

A diagram 600a in FIG. 6A illustrates a cross sectional view of an example of a device that uses the light emitting structures 520a, 520b, and 520c described above in connection with FIG. 5A. The device in this example may be used in a display panel and includes a passivation layer 620 (e.g., corresponding to the passivation layer 560) deposited between the light emitting structures, as well as a contact metal 610 (e.g., n-contact metal) at the end of the device (rightmost side). The passivation layer 620 does not cover a top portion of the conductive contact layer 550 in each of the light emitting structures to enable electrical contact to be made to the structures as shown in a diagram 600b in FIG. 6B. In the diagram 600b, the backplane 310 (see e.g., FIG. 3) may be connected to the device in FIG. 6A through connections 320. In this example, the connections 320 may include display panel connections 320a in contact with the conductive layer 550, and corresponding backplane connections 320b on the backplane 310. While the display panel connections 320a and the backplane connection 320b are shown as bumps, other types of connections may also be used to allow electrical connectivity between the backplane 310 and each of the light emitting structures 520a, 520b, and 520c through their respective conductive contact layers 550.

Figure 6C:
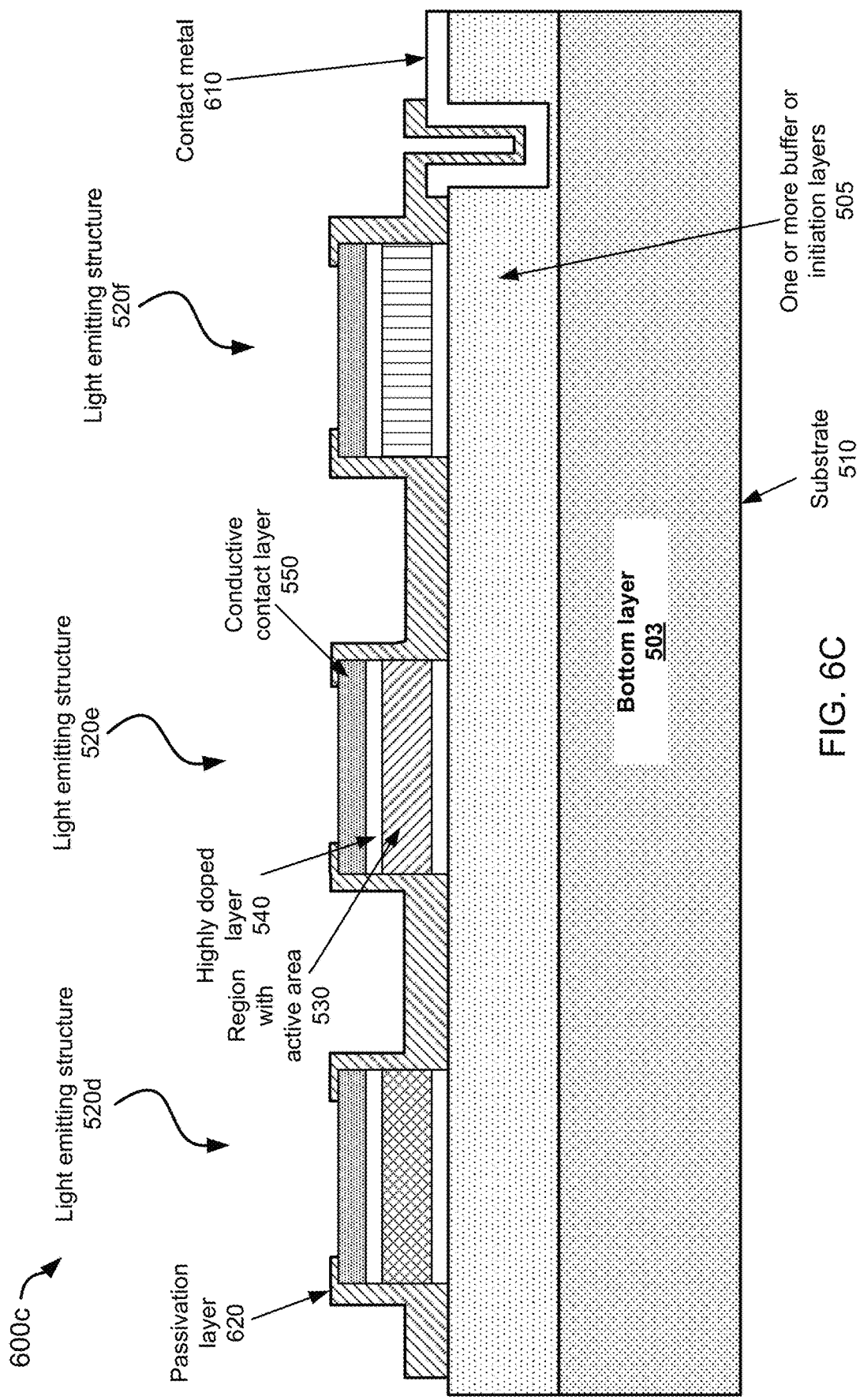
FIG. 6C illustrates a cross sectional view of another example of a device with multiple light emitting structures, in accordance with aspects of this disclosure.
Figure 6D:
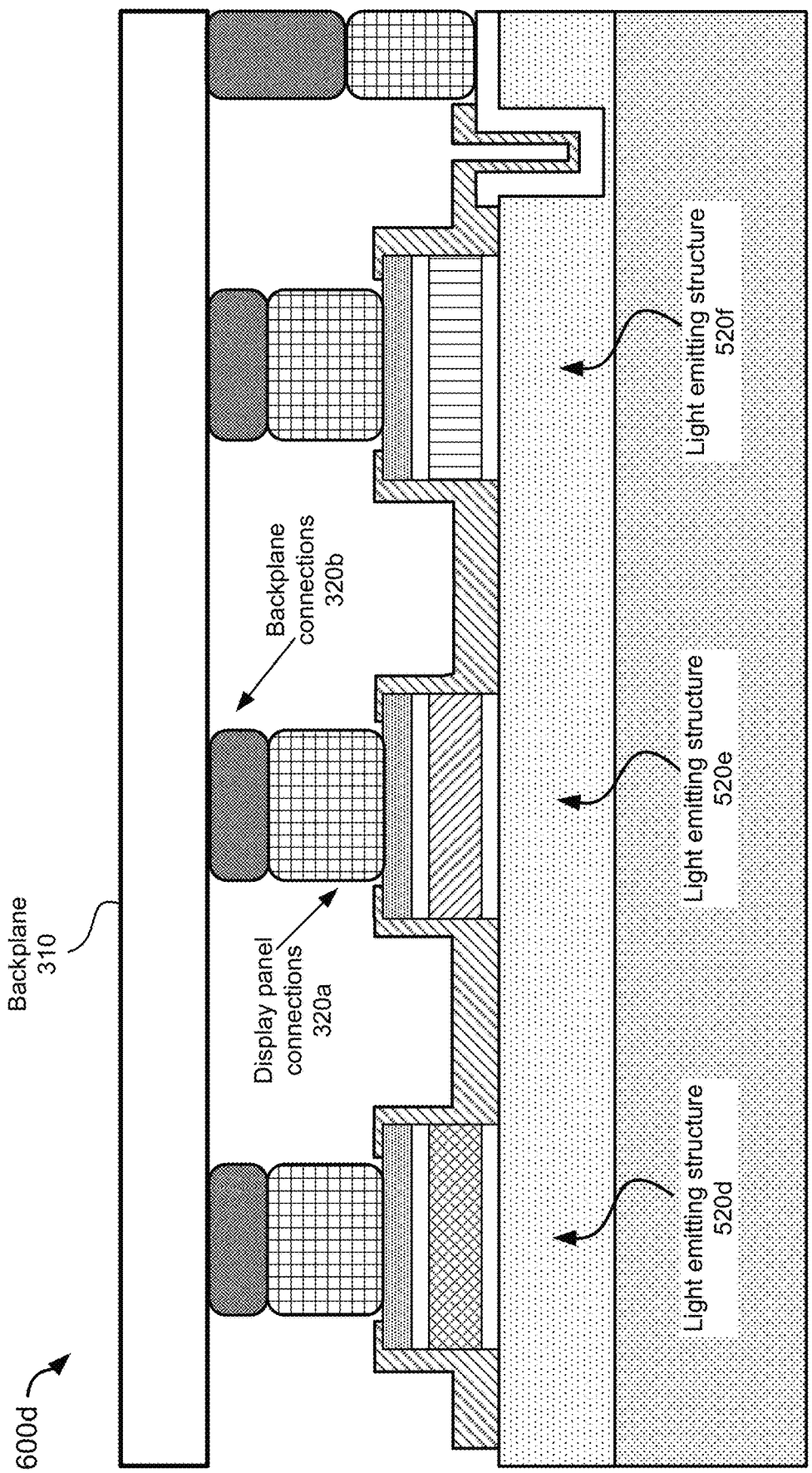
FIG. 6D illustrates a cross sectional view of the device of FIG. 6C connected to a backplane, in accordance with aspects of this disclosure.

A diagram 600c in FIG. 6C illustrates a cross sectional view of an example of a device that uses the light emitting structures 520d, 520e, and 520f described above in connection with FIG. 5B. The device in this example may be used in a display panel and includes a passivation layer 620 (corresponding to the passivation layer 560) deposited between the light emitting structures, as well as a contact metal 610 (e.g., n-contact metal) at the end of the device (rightmost side). The passivation layer 620 does not cover a top portion of the conductive contact layer 550 in each of the light emitting structures to enable electrical contact to be made to the structures as shown in a diagram 600d in FIG. 6D. In the diagram 600d, the backplane 310 may be connected to the device in FIG. 6C through connections 320. In this example, the connections 320 may include display panel connections 320a in contact with the conductive layer 550, and corresponding backplane connections 320b on the backplane 310. While the display panel connections 320a and the backplane connection 320b are shown as bumps, other types of connections may also be used to allow electrical connectivity between the backplane 310 and each of the light emitting structures 520d, 520e, and 520f through their respective conductive contact layers 550.

Figure 7A:
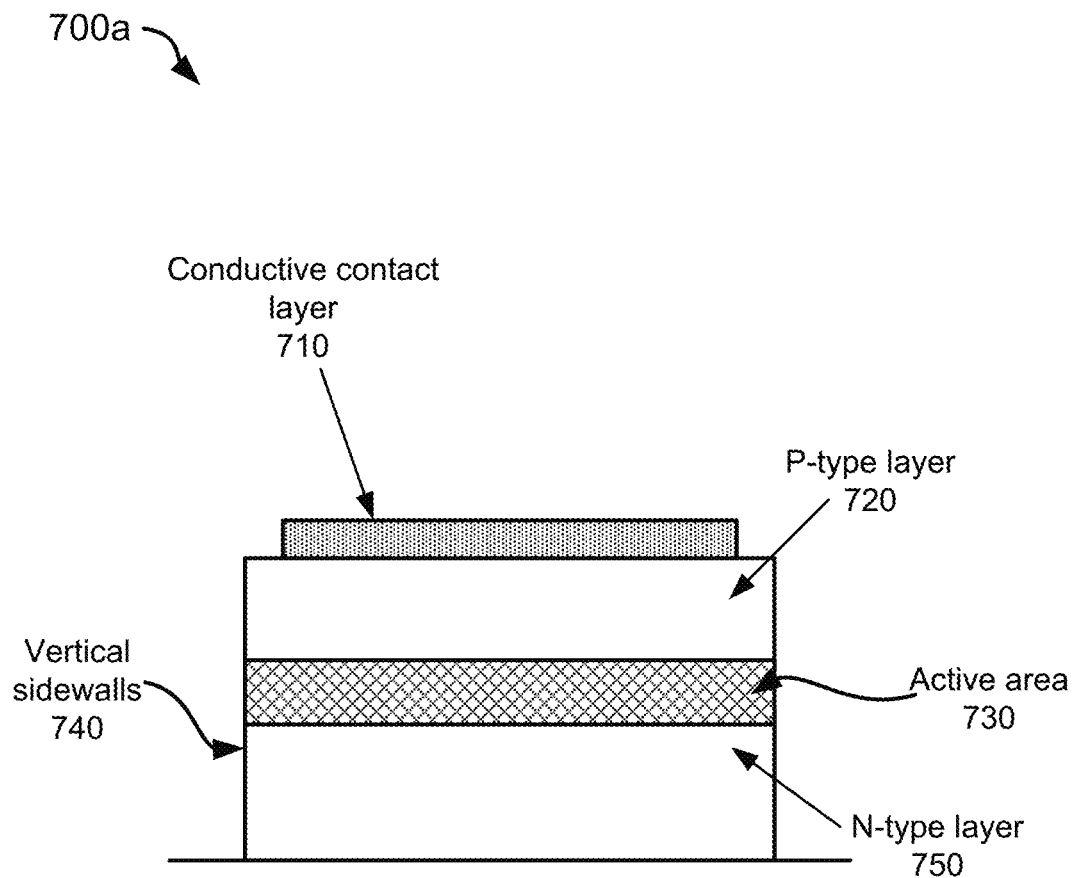
FIGS. 7A-7C illustrate cross sectional views of examples of light emitting structure, in accordance with aspects of this disclosure.
Figure 7B:
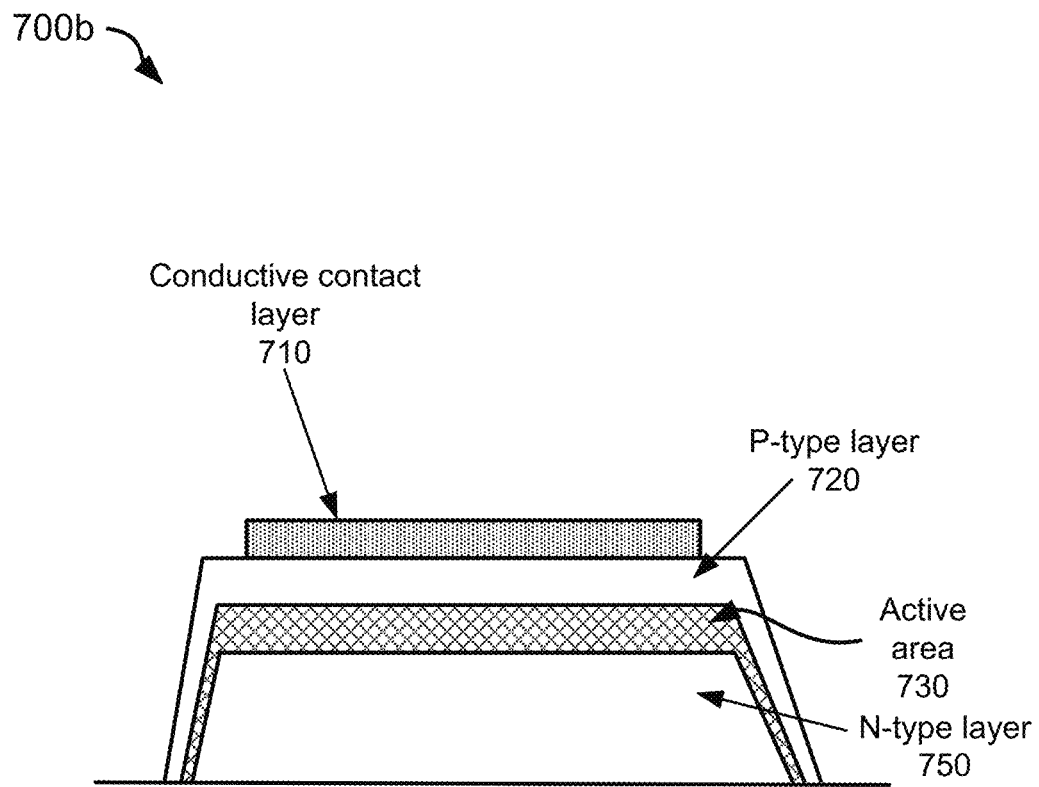
Figure 7C:
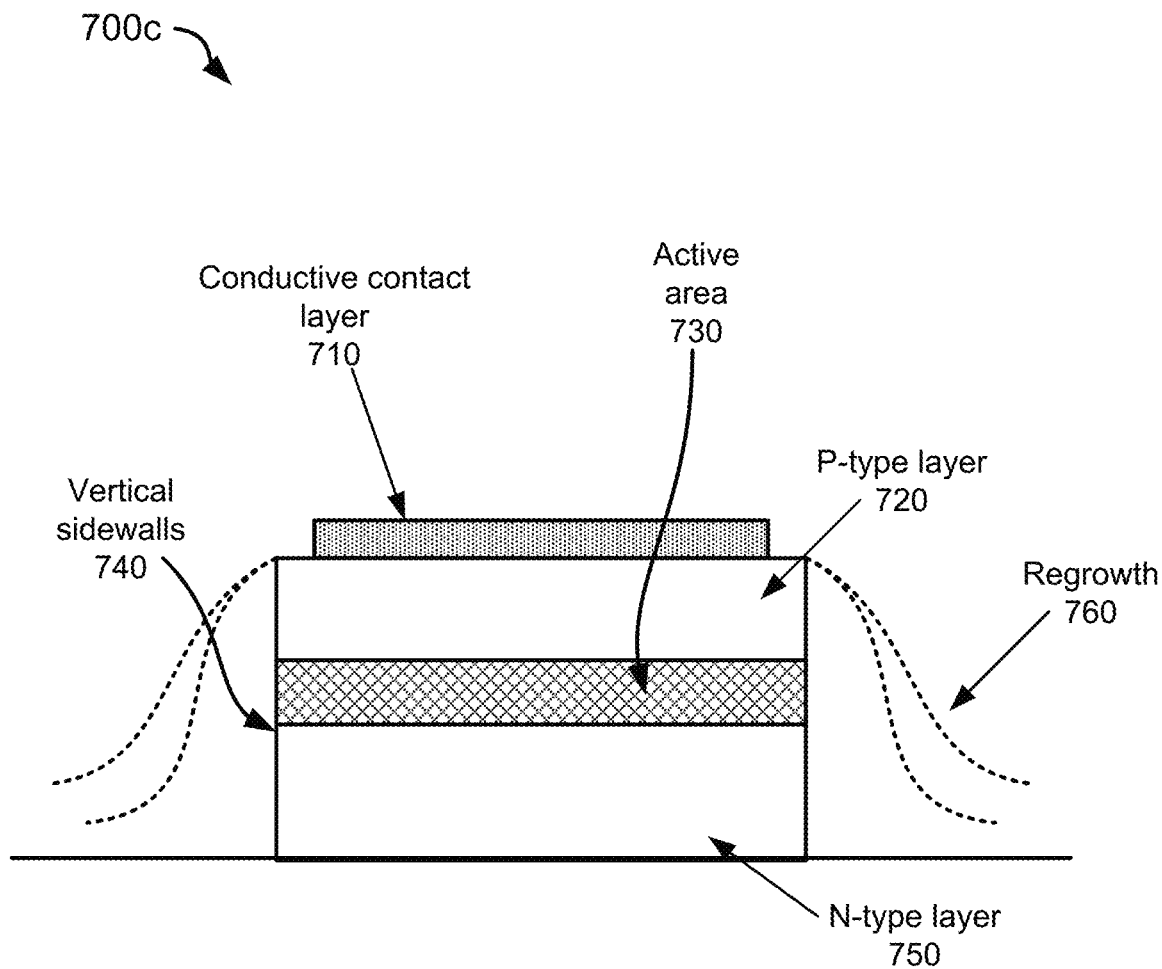

FIGS. 7A-7C illustrate diagrams 700a, 700b, and 700c that show cross sectional views of examples of light emitting structures, in accordance with aspects of this disclosure. For example, the diagram 700a shows a light emitting structure that includes multiple layers. The light emitting structure may include an n-type layer 750, an active area 730 over the n-type layer 750, a p-type layer 720 over the active area 730, and a conductive layer 710 over the p-type layer 720. The active area 730 may include one or more quantum wells, whether in the form of individual quantum well structures or as part of a MQW structure, to produce the appropriate color of light. Additionally or alternatively, the active area 730 may include one or more rare earths to produce the appropriate color of light. The active area 730 may correspond to the active area of the regions 530, the p-type layer 720 may correspond to the highly doped layer 540, and the conductive layer 710 may correspond to the conductive contact layer 550 described above. The n-type layer 750 and the active area 730 may be part of the region 530 also described above. The light emitting structure in the diagram 700a may be an example of the light emitting structures 520d, 520e, and 520f described above in connection with FIGS. 5B, 6C, and 6D having vertical sidewalls, such as vertical sidewalls 740, for example.

The diagram 700b shows a different light emitting structure that also includes multiple layers. The light emitting structure in this example includes the n-type layer 750, the active area 730 over the n-type layer 750, the p-type layer 720 over the active area 730, and the conductive layer 710 over the p-type layer 720. Unlike the example in the diagram 700a, these layers are grown or deposited in such a way that they bend downwards at the end of the structure. The active area 730 may include one or more quantum wells, whether in the form of individual quantum well structures or as part of a MQW structure, to produce the appropriate color of light. The one or more quantum wells may also be constructed in such a way that they bend downwards at the end of the structure within the active area 730. Additionally or alternatively, the active area 730 may include one or more rare earths to produce the appropriate color of light. The active area 730 may correspond to the active area of the regions 530, the p-type layer 720 may correspond to the highly doped layer 540, and the conductive layer 710 may correspond to the conductive contact layer 550 described above. The n-type layer 750 and the active area 730 may be part of the region 530 also described above. Because of its faceted or slanted ends, the light emitting structure in the diagram 700b may be different from the light emitting structures 520d, 520e, and 520f described above in connection with FIGS. 5B, 6C, and 6D having vertical sidewalls.

The diagram 700c shows a similar example to the one in the diagram 700a. In this case, however, a material regrowth may be perform to add a regrowth 760 to the sides of the light emitting structure. The regrowth 760 may vary based on the process characteristics as shown by the different dashed lines indicating the shape of the regrowth 760.

Figure 8A:
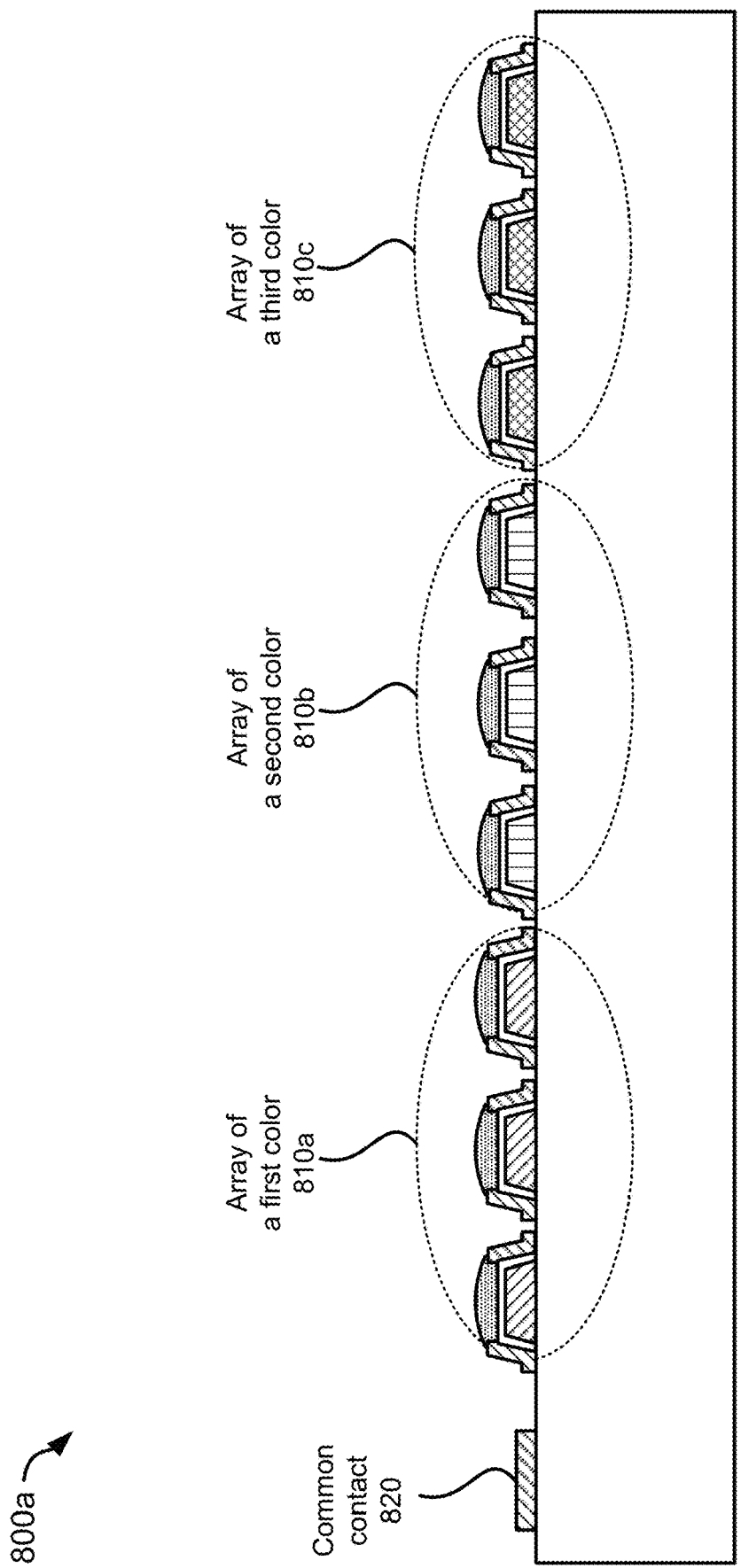
FIGS. 8A and 8B illustrate cross sectional views of arrays or groups of one type of light emitting structure, in accordance with aspects of this disclosure.
Figure 8B:
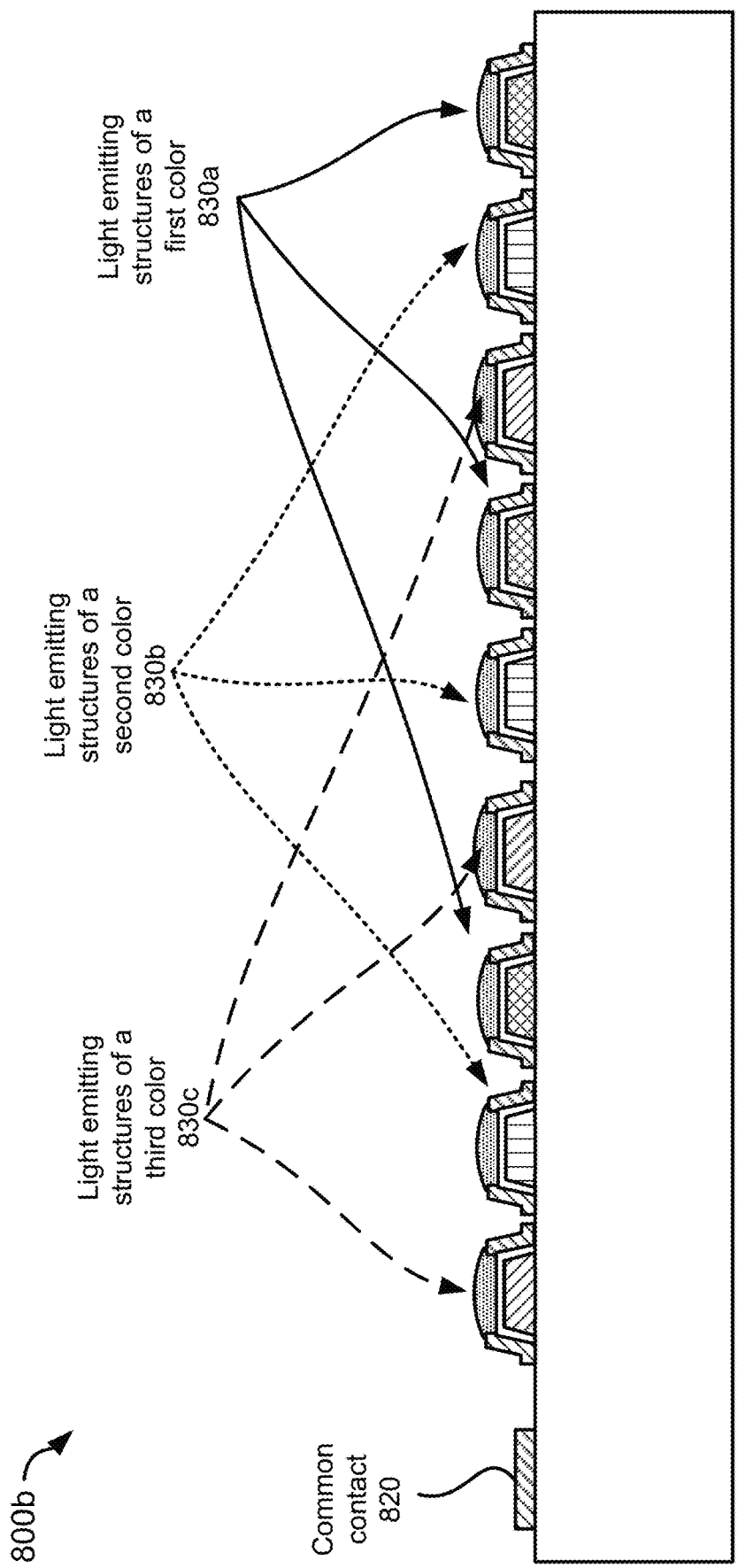

FIGS. 8A and 8B illustrate diagrams 800a and 800b, respectively, that show cross sectional views of arrays or groups of one type of light emitting structures. For example, a device in the diagram 800a may have a first array 810a of light emitting structures that produce a first color of light, a second array 810b of light emitting structures that produce a second color of light, and a third array 810c of light emitting structures that produce a third color of light. In an example, these light emitting structures may be similar to the type of light emitting structures in the diagram 500a in FIG. 5A (e.g., light emitting structures 520a, 520b, and 520c). Although only three different light emitting structures, and therefore three different types of colors, are shown, it is to be understood that the number of light emitting structures may be larger or smaller than three. In this example, light emitting structures that produce the same color of light may be placed together to form the arrays. These arrays may be consistent with, for example, the arrangement of sub-picture elements described in the diagram 400b in FIG. 4B. In the example in the diagram 800a, a common contact 820 may be used for all of the light emitting structures in the various arrays 810a, 810b, and 810c.

A device in the diagram 800b may have a first group 830a of light emitting structures that produce a first color of light, a second group 830b of light emitting structures that produce a second color of light, and a third group 830c of light emitting structures that produce a third color of light. In an example, these light emitting structures may be similar to the type of the light emitting structures in the diagram 500a in FIG. 5A (e.g., light emitting structures 520a, 520b, and 520c). Although only three different light emitting structures, and therefore three different types of colors, are shown, it is to be understood that the number of light emitting structures may be larger or smaller than three. In this example, light emitting structures that produce the same color of light may be placed in some sequence (e.g., a two dimensional sequence or arrangement). These groups may be consistent with, for example, the layout or arrangement of raxels and super-raxels described in the diagram 400a in FIG. 4A. In the example in the diagram 800b, the common contact 820 may be used for all of the light emitting structures in the various groups 830a, 830b, and 830c.

Figure 8C:
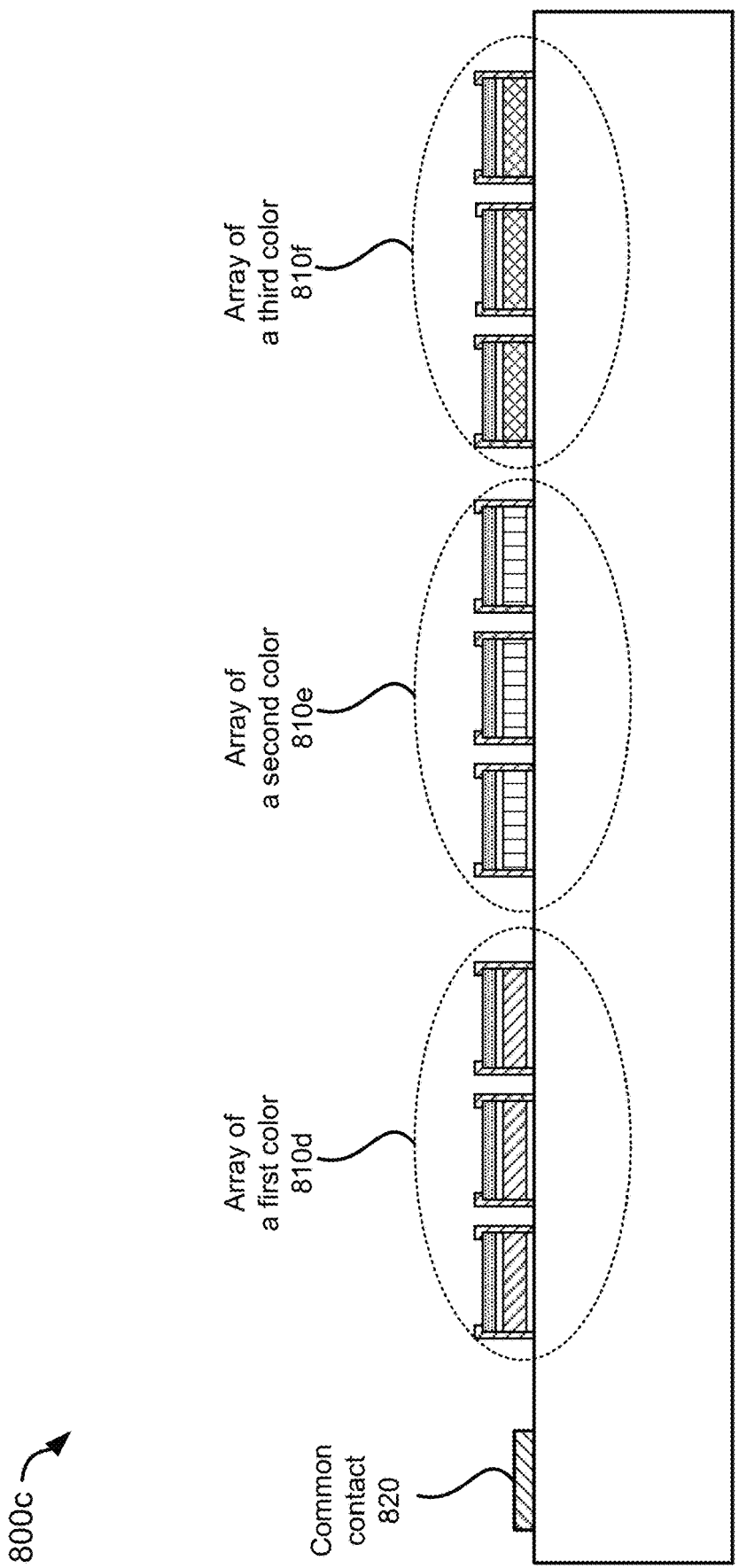
FIGS. 8C and 8D illustrate cross sectional views of arrays or groups of another type of light emitting structure, in accordance with aspects of this disclosure.
Figure 8D:
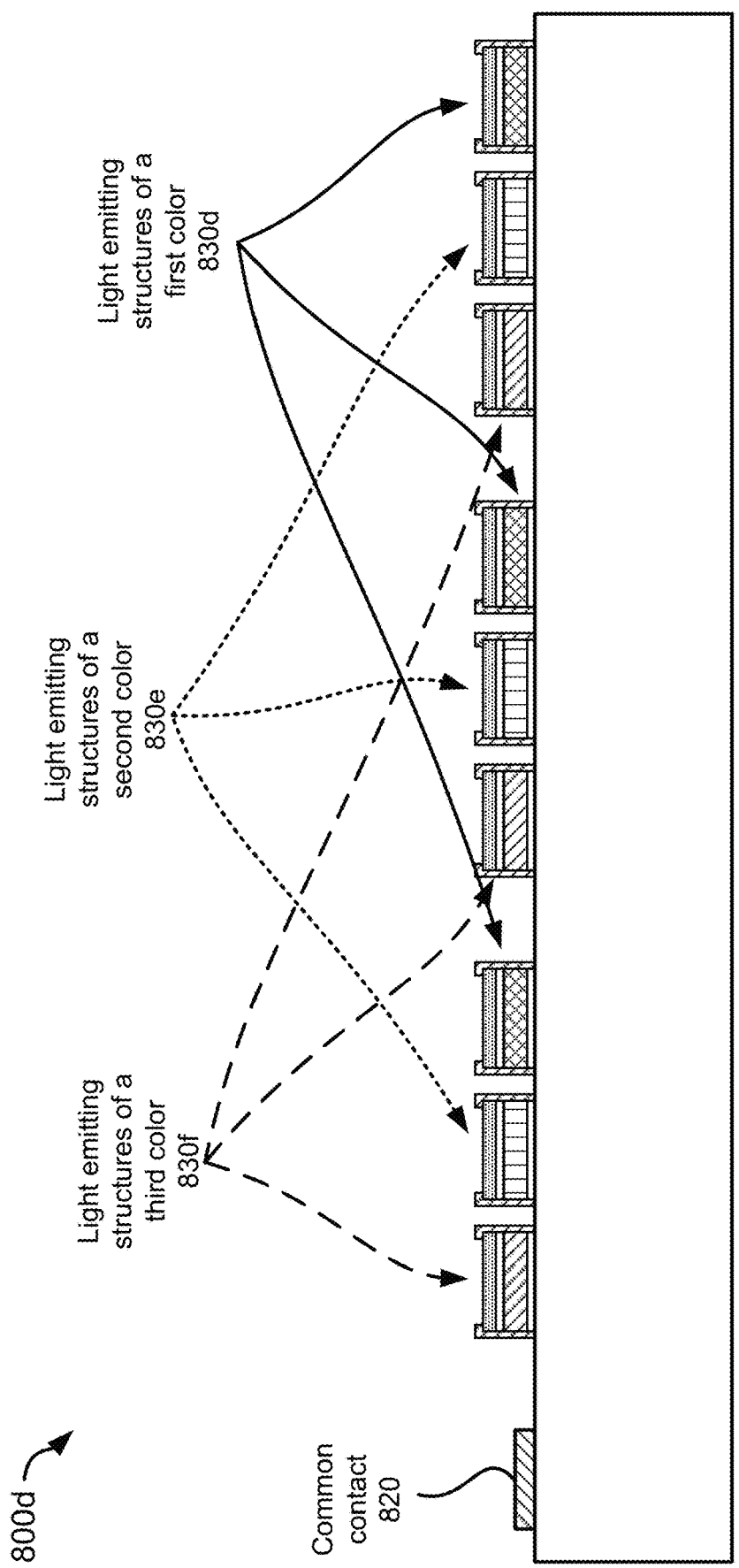

FIGS. 8C and 8D illustrate diagrams 800c and 800d, respectively, that show cross sectional views of arrays or groups of another type of light emitting structures. The diagram 800c is similar to the diagram 800a and includes a device with a first array 810d of light emitting structures that produce a first color of light, a second array 810e of light emitting structures that produce a second color of light, and a third array 810f of light emitting structures that produce a third color of light. The light emitting structures in these arrays may be similar to the type of light emitting structures in the diagram 500b in FIG. 5B (e.g., light emitting structures 520d, 520e, and 5200, and these arrays may be consistent with, for example, the arrangement of sub-picture elements described in the diagram 400b in FIG. 4B The diagram 800d is similar to the diagram 800b and includes a device with a first group 830d of light emitting structures that produce a first color of light, a second group 830e of light emitting structures that produce a second color of light, and a third group 830f of light emitting structures that produce a third color of light. The light emitting structures in these groups may be similar to the type of light emitting structures in the diagram 500b in FIG. 5B (e.g., light emitting structures 520d, 520e, and 5200, and these groups may be consistent with, for example, the layout or arrangement of raxels and super-raxels described in the diagram 400a in FIG. 4A.

The devices described above (e.g., in FIGS. 5A-6D, 7A-7C, and 8A-8D) with monolithically integrated light emitting structures on a single substrate may be part of, for example, a display panel such as the panel 150 in the diagram 100 in FIG. 1. When the device is capable of having all of the light emitting structures (light emitting elements) that are needed for the display, then a single device (e.g., a single substrate) may be sufficient. Otherwise, multiple devices may need to be combined (e.g., stitched together) to provide the number and/or density of light emitting structures (light emitting elements) that are needed for the display.

Figure 9A:
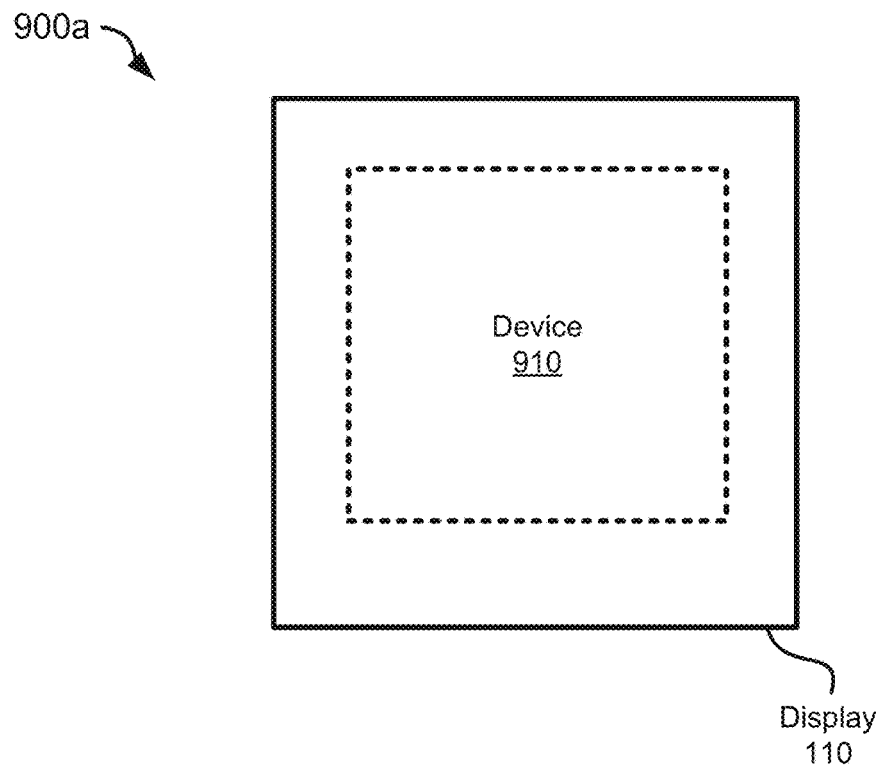
FIGS. 9A and 9B illustrate diagrams of different examples of arrangements of devices for light generation in a display, in accordance with aspects of this disclosure.
Figure 9B:
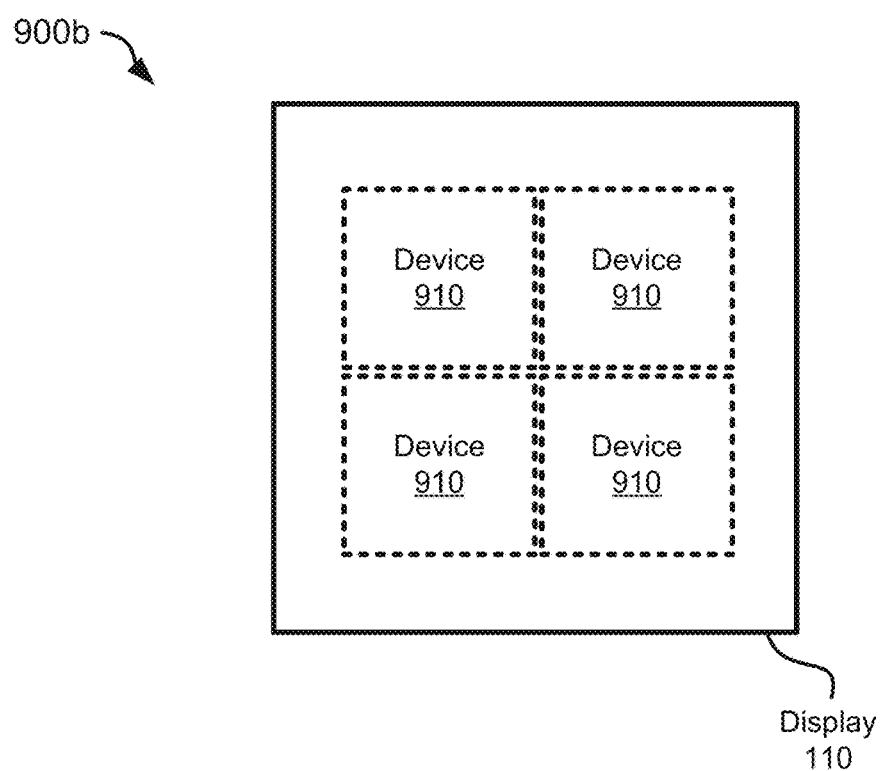

FIGS. 9A and 9B illustrate diagrams 900a and 900bm, respectively, of different examples of arrangements of devices for light generation in a display. In the diagram 900a, a single device 910 (e.g., one of the devices in FIGS. 5A-6D, 7A-7C, and 8A-8D) may have a sufficient number and/or density of monolithically integrated light emitting structures to provide the light emitting elements needed for the display 110 to operate appropriately. In the diagram 900b, a single device 910 does not have a sufficient number and/or density of monolithically integrated light emitting structures to provide the light emitting elements needed for the display 110 to operate appropriately. In such a case, multiple devices 910 may need to be combined together. The multiple devices 910 may be of the same size or of different sizes, so long as their combination has a sufficient number and/or density of monolithically integrated light emitting structures to provide the light emitting elements needed for the display 110 to operate appropriately.

In connection with the description of FIGS. 1-9B above, the present disclosure describes a device for light generation that includes a substrate (e.g., the substrate 510) having one or more buffer layers (e.g., one or more buffer or initiation layers (505) that are made at least in part of a material that includes GaN. The device may also include light emitting structures (e.g., light emitting structures 520a, . . . , 520f) epitaxially grown on a same surface of a top one of the one or more buffer layers, each light emitting structure having an active area (e.g., the active area 730) parallel to the surface and laterally terminated, and the active area of different light emitting structures being configured to directly generate a different color of light. Direct generation may refer to light generation by a transition or similar effect taking place within the active area, or between the active area and another structure physically coupled to the light emitting structure. The device may further include a p-doped layer (e.g., the highly doped layer 540, the p-type layer 720) disposed over the active area of each of the light emitting structures and made at least in part of a p-doped material that includes GaN. In this disclosure, a material that includes GaN may also refer to a material that includes a GaN alloy, for example. The active region may also be vertically confined.

In another aspect of the device for light generation, the device may also include a contact layer (e.g., the conductive contact layer 550, the conductive contact layer 710) disposed over the p-doped layer. The contact layer may be a conductive layer and is one of a metal contact layer or a transparent contact layer. In one example, the transparent contact is made of indium tin oxide (ITO), an alloy of nickel (Ni) and gold (Au), or an alloy of Ni and Au annealed with oxygen (O).

In another aspect of the device for light generation, the one or more buffer layers may be epitaxially grown on the substrate. The material from which the top one of the one or more buffer layers is made includes GaN. The material from which the one or more buffer layers are made includes a GaN alloy. The p-doped material from which the p-doped layer is made includes a GaN alloy. In some instances, the material from which the one or more buffer layers are made and the p-doped material from which the p-doped layer is made are the same material.

In another aspect of the device for light generation, the different light emitting structures may include one or more light emitting structures having their active areas made of a material that includes InGaN with a bandgap configured to directly generate blue light, one or more light emitting structures having their active areas made of a material that includes InGaN with a bandgap configured to directly generate green light, and one or more light emitting structures having their active areas made of the material that includes InGaN with a bandgap configured to directly generate red light. The different light emitting structures may further include one or more light emitting structures having their active areas made of a material that includes InGaN with a bandgap configured to directly generate a light different from blue light, green light, and red light.

In another aspect of the device for light generation, the different light emitting structures may include one or more light emitting structures having at least one quantum well in their active areas configured to directly generate blue light, one or more light emitting structures having at least one quantum well in their active areas configured to directly generate green light, and one or more light emitting structures having at least one quantum well in their active areas configured to directly generate red light. The different light emitting structures may further include one or more light emitting structures having at least one quantum well in their active areas configured to directly generate a light different from blue light, green light, and red light.

In another aspect of the device for light generation, the different light emitting structures include one or more light emitting structures having one or more rare earths in their active areas such that the active areas are configured to generate blue light, one or more light emitting structures having one or more rare earths in their active areas such that the active areas are configured to generate green light, and one or more light emitting structures having one or more rare earths in their active areas such that the active areas are configured to generate red light. The different light emitting structures may further include one or more light emitting structures having one or more rare earths in their active areas such that the active areas are configured to generate a light different from blue light, green light, and red light. The one or more rare earths include one or more of Eu, Er, Tm, Gd, or Pr (e.g., Eu3+, Er3+, Tm3+, Gd+3, Pr+3, or other charged states of these materials).

In another aspect of the device for light generation, the light emitting structures are arranged in a grid-like pattern (see e.g., FIGS. 4A and 4B). The grid-like pattern may be a square pattern, a rectangular pattern, or a hexagonal pattern, for example. The grid-like pattern may include one or more repeated sequences of the different light emitting structures.

In another aspect of the device for light generation, the active area includes a bulk active area. The active area may be doped with one or more rare earths. Examples of the one or more rare earths include one or more of Eu, Er, Tm, Gd, or Pr. In an example, any of Eu3+, Er3+, Tm3+, Gd+3, or Pr+3 may be used. These charged states are provided only by way of illustration and other charged states may also be used. The charged states used may depend on the matrix in which the rare earths are embedded. The one or more rare earths may be included in a superlattice in the active area or in a bulk active area. The active area may be laterally terminated by vertical sidewalls (e.g., the vertical sidewalls 740).

In another aspect of the device for light generation, the active area includes at least one quantum well parallel to the surface of the top one of the one or more buffer layers. The at least one quantum well may have a uniform thickness.

In another aspect of the device for light generation, each light emitting structure has faceted sidewalls (e.g., sides or sidewalls of light emitting structures 520a, 520b, 520c, and light emitting structure in the diagram 700b in FIG. 7B). The active area in these types of light emitting structure may include at least one quantum well. The faceted sidewalls are on planes other than planes perpendicular to a direction of growth of the light emitting structures.

In another aspect of the device for light generation, the active area may be laterally terminated by an epitaxially regrown passivation (see e.g., light emitting structure in the diagram 700c in FIG. 7C).

In another aspect of the device for light generation, each light emitting structure has sidewalls, and a passivation material (e.g., the passivation layer 560, 620) is disposed adjacent to the sidewalls. The passivation material may have a bandgap wider than a bandgap of GaN. The passivation material may include $Ga_2O_3$ or $Al_2O_3$. The active area may include at least one quantum well, and the passivation material may have a bandgap wider than a bandgap of the at least one quantum well. The passivation material may have an opposite doping to a doping of a corresponding portion of the light emitting structure. The passivation material may have midgap states or deep levels that are not ionized at room temperature or at an operating temperature. The sidewalls in this case may be vertical sidewalls.

In another aspect of the device for light generation, each light emitting structure has sidewalls, and a dielectric passivation (e.g., the passivation layer 560, 620) disposed adjacent to the sidewalls. A material of the dielectric passivation may have a bandgap higher than a bandgap of GaN or InGaN. The sidewalls in this case may be vertical sidewalls.

In another aspect of the device for light generation, a width of each light emitting structure or a pitch between adjacent light emitting structures is in one of the following ranges: less than 1 micron, between 1 micron and 5 microns, or greater than 5 microns.

In another aspect of the device for light generation, a contact layer (e.g., the conductive contact layer 550) may be disposed over the p-doped layer; and a connection (e.g., connections 520) may be disposed on the contact layer and configured to electrically connect each of the light emitting structures in the device to a display backplane (e.g., the backplane 310). The contact layer disposed over the p-doped layer may be a conductive layer and is one of a metal contact layer or a transparent contact layer, while the connection may be a metal bump.

In another aspect of the device for light generation, the light emitting structures may be arranged into different arrays or groups based on the different colors of light, the device further includes a first contact layer (e.g., p-type contact, the conductive contact layer 550) disposed over the p-doped layer, and a second contact layer (e.g., n-type contact, the contact 820) disposed over the top buffer layer.

In another aspect of the device for light generation, the light emitting structures may be arranged into different arrays or groups based on the different colors of light, the device further includes a first contact layer (e.g., p-type contact, the conductive contact layer 550) disposed over the p-doped layer, a second contact layer (e.g., n-type contact, the contact 820) disposed over the top buffer layer, and one or more trenches defined into the one or more buffer layers to isolate at least some of the light emitting structures.

In another aspect of the device for light generation, the light emitting structures are arranged into different arrays or groups each containing mixed colors of light emission, the device further including a first contact layer (e.g., p-type contact, the conductive contact layer 550) disposed over the p-doped layer, and a second contact layer (e.g., n-type contact, the contact 820) disposed over the top buffer layer.

In another aspect of the device for light generation, the light emitting structures are arranged into different arrays or groups each containing mixed colors of light emission, the device further includes a first contact layer (e.g., p-type contact, the conductive contact layer 550) disposed over the p-doped layer, a second contact layer (e.g., n-type contact, the contact 820) disposed over the top buffer layer, and one or more trenches defined into the one or more buffer layers to isolate at least some of the light emitting structures.

In another aspect of the device for light generation, the light emitting structures are micro light emitting devices or micro-LEDs.

In another aspect of the device for light generation, the device is part of a light field display (e.g., the light field display 210a) and is connected to a backplane of the light field display (e.g., the backplane 310).

In another aspect of the device for light generation the device is a first device (e.g., the device 910 in FIGS. 9A and 9B), a second device is substantially similar to the first device, and the first device and the second device are part of a display, such as a light field display.

The present disclosure describes various techniques and devices that enable monolithically integrating light emitting structures that generate different colors of light on a same substrate.

Accordingly, although the present disclosure has been provided in accordance with the implementations shown, one of ordinary skill in the art will readily recognize that there could be variations to the embodiments and those variations would be within the scope of the present disclosure. Therefore, many modifications may be made by one of ordinary skill in the art without departing from the scope of the appended claims.

What is claimed is:
1. A device for light generation, comprising:
a substrate including at least one buffer layer including gallium nitride (GaN);
a plurality of light emitting structures defined from an epitaxial layer disposed on a surface of the at least one buffer layer, each of the plurality of light emitting structures having an active area that is parallel to the surface and is laterally terminated,
the plurality of light emitting structures including:
a first light emitting structure configured to emit light of a first color;
a second light emitting structure configured to emit light of a second color different than the first color; and
a third light emitting structure configured to emit light of a third color different than the first color and the second color;
a respective p-doped layer disposed on the active area of each of the plurality of light emitting structures, the respective p-doped layers including GaN; and
a single contact metal electrically disposed on a portion of the at least one buffer layer and configured to be electrically connected to a backplane for driving the plurality of light emitting structures via the backplane, the single contact metal being laterally spaced, on the at least one buffer layer, from the first light emitting structure, the second light emitting structure, and the third light emitting structure.

2. The device of claim 1, wherein the first single contact metal is disposed in a recessed portion of the substrate.

3. The device of claim 1, further comprising a dielectric layer that electrically isolates the single contact metal from the first light emitting structure, the second light emitting structure, and the third light emitting structure.

4. The device of claim 1, wherein the first light emitting structure, the second light emitting structure, and the third light emitting structure are monolithically disposed on the substrate.

5. The device of claim 4, wherein the first light emitting structure, the second light emitting structure, and the third light emitting structure include respective layers that are epitaxial to the substrate.

6. The device of claim 4, wherein the first light emitting structure, the second light emitting structure, and the third light emitting structure have respective active regions configured to emit different colors of light.

7. The device of claim 1, wherein the first light emitting structure, the second light emitting structure, and the third light emitting structure are included in a pixel of the device.

8. The device of claim 1, wherein the first light emitting structure, the second light emitting structure, and the third light emitting structure are mesa-shaped.

9. The device of claim 1, wherein the first light emitting structure, the second light emitting structure, and the third light emitting structure are disposed on the substrate, and adjacent to one another.

10. The device of claim 1, wherein the substrate includes gallium nitride.

11. A micro-LED display, comprising:
a substrate including at least one buffer layer including gallium nitride (GaN);
a red micro-LED, a green micro-LED, and a blue micro-LED defined from an epitaxial layer disposed on a surface of the at least one buffer layer, the red micro-LED, the green micro-LED, and the blue micro-LED each having an active area that is parallel to the surface and is laterally terminated,
respective p-doped layers disposed on the active area of each of the red micro-LED, the green micro-LED, and the blue micro-LED, the respective p-doped layers including GaN; and
a single contact metal electrically disposed on a portion of the at least one buffer layer and configured to be electrically connected to a backplane for driving the red micro-LED, the green micro-LED, and the blue micro-LED via the backplane, the single contact metal being laterally spaced, on the at least one buffer layer, from the red micro-LED, the green micro-LED, and the blue micro-LED.

12. The micro-LED display of claim 11, wherein the single contact metal is disposed in a recessed portion of the substrate.

13. The micro-LED display of claim 11, further comprising a dielectric layer that electrically isolates the single contact metal from the red micro-LED, the green micro-LED, and the blue micro-LED.

14. The micro-LED display of claim 11, wherein the red micro-LED, the green micro-LED, and the blue micro-LED are monolithically disposed on the substrate.

15. The micro-LED display of claim 14, wherein the red micro-LED, green micro-LED, and the blue micro-LED include respective layers that are epitaxial to the substrate.

16. The micro-LED display of claim 14, wherein the red micro-LED, the green micro-LED, and blue micro-LED have respective active regions configured to emit different colors of light.

17. The micro-LED display of claim 11, wherein the red micro-LED, the green micro-LED, and blue micro-LED are included in a pixel of the micro-LED display.

18. The micro-LED display of claim 11, wherein the red micro-LED, green micro-LED, and the blue micro-LED are mesa-shaped.

19. The micro-LED display of claim 11, wherein the red micro-LED, the green micro-LED, and the blue micro-LED are disposed on the substrate, and adjacent to one another.

20. The micro-LED display of claim 11, wherein the substrate includes gallium nitride.

* * * * *